United States Patent
Kim et al.

(10) Patent No.: US 12,428,435 B2
(45) Date of Patent: Sep. 30, 2025

(54) ALUMINUM PRECURSOR COMPOUND, PRODUCTION METHOD THEREFOR, AND ALUMINUM CONTAINING LAYER FORMING METHOD USING SAME

(71) Applicant: UP CHEMICAL CO., LTD., Pyeongtaek-si (KR)

(72) Inventors: Jin Sik Kim, Pyeongtaek-si (KR); Myeong Ho Kim, Cheonan-si (KR); Dae-Young Kim, Pyeongtaek-si (KR); Jun Hwan Choi, Goyang-si (KR); In Jae Lee, Pyeongtaek-si (KR)

(73) Assignee: UP CHEMICAL CO., LTD., Pyeongtaek-si (KR)

( * ) Notice: Subject to any disclaimer, the term of this patent is extended or adjusted under 35 U.S.C. 154(b) by 435 days.

(21) Appl. No.: 17/894,203

(22) Filed: Aug. 24, 2022

(65) Prior Publication Data

US 2023/0019365 A1    Jan. 19, 2023

Related U.S. Application Data

(63) Continuation of application No. PCT/KR2021/002314, filed on Feb. 24, 2021.

(30) Foreign Application Priority Data

Feb. 24, 2020    (KR) .......................... 10-2020-0022146

(51) Int. Cl.
*C07F 5/06*    (2006.01)
*C23C 16/18*    (2006.01)

(52) U.S. Cl.
CPC .............. *C07F 5/069* (2013.01); *C07F 5/062* (2013.01); *C07F 5/066* (2013.01)

(58) Field of Classification Search
CPC .. C07F 5/066; C07F 5/06; C07F 5/069; C23C 16/45553; C23C 16/18
See application file for complete search history.

(56) References Cited

U.S. PATENT DOCUMENTS

| | | | | |
|---|---|---|---|---|
| 7,985,450 | B2 * | 7/2011 | Shin ........................ | C23C 16/20 427/252 |
| 11,912,728 | B2 * | 2/2024 | Han ................... | C23C 16/45553 |
| 2005/0003662 | A1 | 1/2005 | Jursich | |
| 2006/0193984 | A1 | 8/2006 | Peters | |
| 2007/0071893 | A1 * | 3/2007 | Lee ......................... | C07F 5/062 556/175 |
| 2020/0030844 | A1 | 1/2020 | Lee | |

FOREIGN PATENT DOCUMENTS

| | | | |
|---|---|---|---|
| CN | 1280209 A | 1/2001 | |
| CN | 1798866 A | 7/2006 | |
| CN | 101029384 A | 9/2007 | |
| CN | 101155640 A | 4/2008 | |
| CN | 104004007 A | 8/2014 | |
| CN | 107406465 A | 11/2017 | |
| CN | 107619419 A | 1/2018 | |
| CN | 108603046 A | 9/2018 | |
| DE | 2022658 A1 * | 11/1970 | |
| KR | 10-0689668 B1 | 3/2007 | |
| KR | 10-2007-0107124 A | 11/2007 | |
| KR | 10-2014-0106769 A | 9/2014 | |
| KR | 10-2016-0027231 A | 3/2016 | |
| KR | 10-2016-0082321 A | 7/2016 | |
| KR | 10-2016-0101697 A | 8/2016 | |
| KR | 10-2017-0058820 A | 5/2017 | |
| WO | 2004/108985 A2 | 12/2004 | |
| WO | 2016108398 A1 | 7/2016 | |
| WO | WO-2020027552 A1 * | 2/2020 | .............. C07F 5/069 |

OTHER PUBLICATIONS

The Penguin Dictionary of Science (M.G. Clugston ed., 2009) (Year: 2009).*
IUPAC, Compendium of Chemical Terminology, Gold Book, p. 784 of 1622 (2014) (Year: 2014).*
IUPAC, Compendium of Chemical Terminology, Gold Book, p. 60 of 1622 (2014) (Year: 2014).*
International Search Report of PCT/KR2021/002314 dated Jun. 3, 2021.
Sydney C. Buttera et al., Tris(dimethylamido)aluminum(III): An overlooked atomic layer deposition precursor, American Vacuum Society. 2016, vol. 35, No. 1, Jan./Feb. 2017.
Everett M. Marlett et al., Dimethylethylamine alane and Nmethylpyrrolidine alane. A convenient synthesis of alane, a useful selective reducing agent in organic synthesis, The Journal of Organic Chemistry. 1990, vol. 55, pp. 2968-2969.
Michael G. Simmonds et al., Selective Area Chemical Vapor Deposition of Aluminum Using Dimethylethylamine Alane, Chemistry of Materials. 1994, vol. 6, pp. 935-942.

* cited by examiner

*Primary Examiner* — Alexander R Pagano
*Assistant Examiner* — Frank S. Hou
(74) *Attorney, Agent, or Firm* — Shih IP Law Group, PLLC

(57) ABSTRACT

The present disclosure relates to an aluminum compound, an aluminum-containing film-forming precursor composition including the aluminum compound, and a method of preparing an aluminum-containing film using the aluminum-containing film-forming precursor composition.

11 Claims, 2 Drawing Sheets

[FIG. 1]
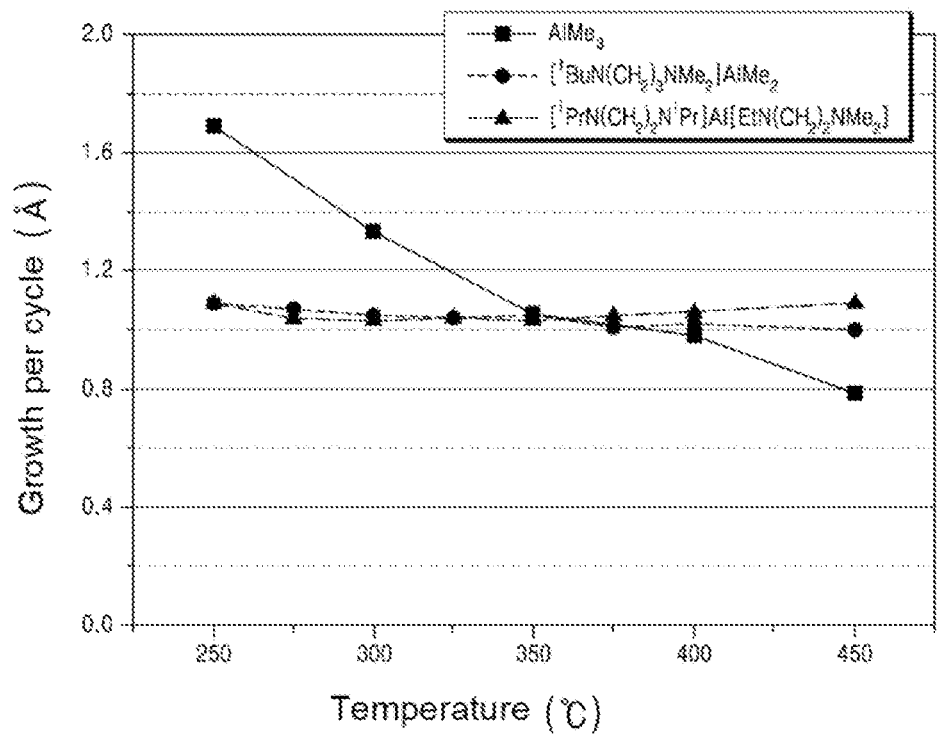
[FIG. 2]
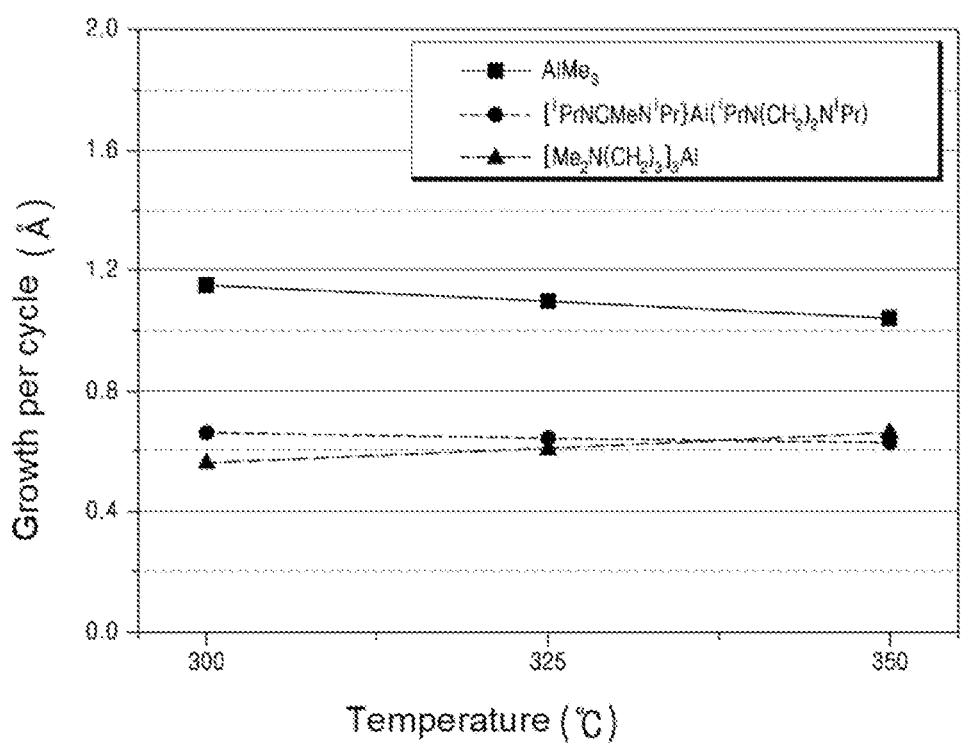

[FIG. 3]
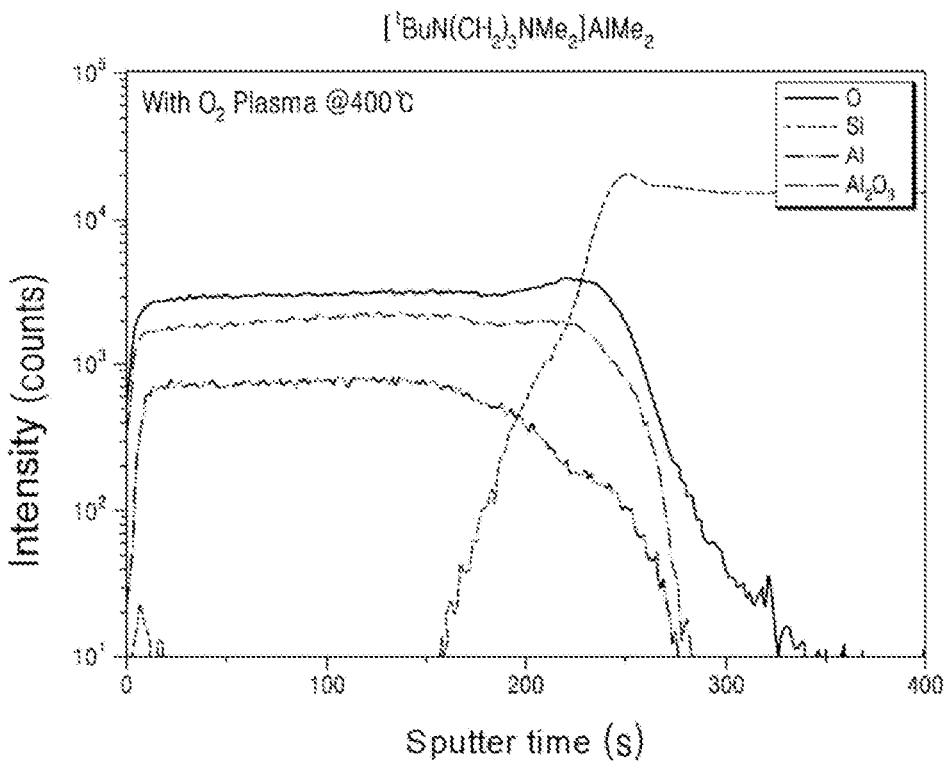
[FIG. 4]
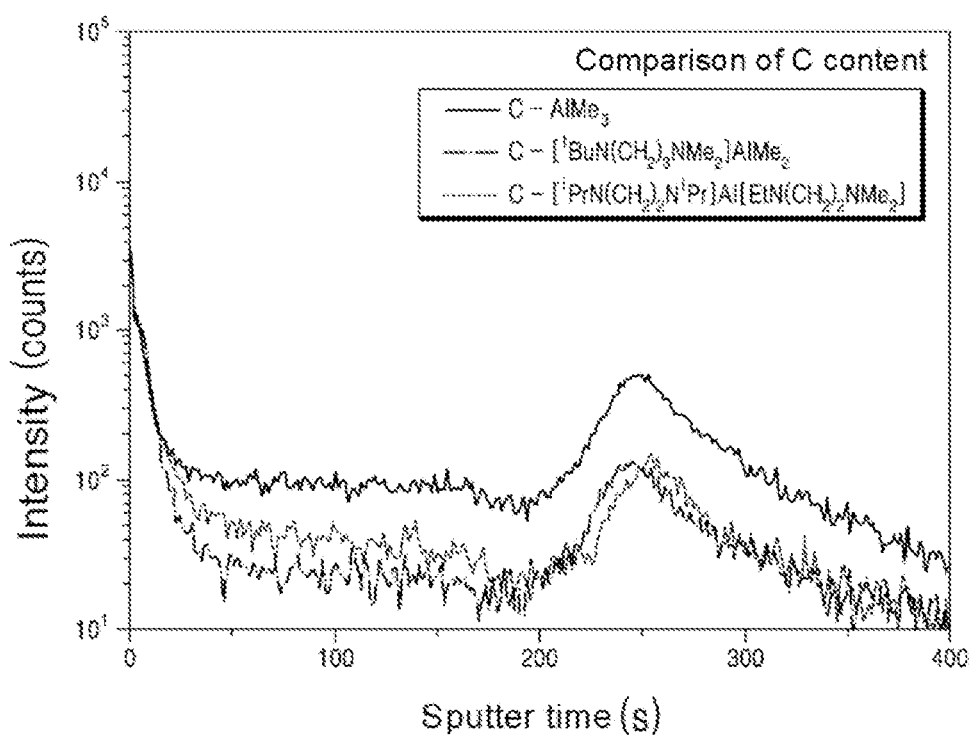

ALUMINUM PRECURSOR COMPOUND, PRODUCTION METHOD THEREFOR, AND ALUMINUM CONTAINING LAYER FORMING METHOD USING SAME

CROSS-REFERENCE TO RELATED APPLICATIONS

This application is a continuation of PCT Application No. PCT/KR2021/002314, filed on Feb. 24, 2021, which claims priority to Korean Patent Application Number 10-2020-0022146, filed on Feb. 24, 2020, both of which are hereby incorporated by reference in their entirety.

TECHNICAL FIELD

The present disclosure relates to an aluminum compound, an aluminum-containing film-forming precursor composition including the aluminum compound, and a method of forming an aluminum-containing film using the aluminum-containing film-forming precursor composition.

BACKGROUND

Aluminum-containing oxide and nitride films are examples of the thin films which are essential for driving microelectronic devices, such as non-semiconductor logic devices and image sensors, as well as semiconductors (DRAM, Flash Memory, ReRAM, etc.). In a memory device, aluminum-containing thin films have been used for a gate insulating film, a capacitor high-k film, etc. In the display field, aluminum oxide films may be used for a high-k film of a storage capacitor in an organic light emitting diode (OELD) and may also be used for an encapsulation layer and an antireflection film in the OELD. Further, aluminum nitride films have been used for an etch stopper and a diffusion barrier in a memory device, and aluminum-containing films may also be used for composite films of TiAlN, ZrAlN, HfAlN, SiAlN, etc. for electrodes of memory and logic devices.

An atomic layer deposition method using trimethylaluminum (AlMe$_3$, TMA) is widely used for the purpose of forming an aluminum oxide film. However, in the atomic layer deposition method using TMA, when the deposition temperature increases, the growth-per-cycle (GPC) per ALD gas supply cycle decreases. When an extremely thin aluminum-containing film with a thickness of several nm or 1 nm or less required for next-generation semiconductor devices is formed, if the GPC per ALD gas supply cycle is constant despite a change in deposition temperature, it is advantageous in reducing variations among apparatuses in a mass production process using several apparatuses. This ALD process uses TMA and thus is not possible. Therefore, a new aluminum precursor compound is needed. Also, in order to form an extremely thin aluminum-containing film with a thickness of several nm or 1 nm or less by controlling the number of ALD gas supply cycles, a lower GPC per ALD gas supply cycle is more preferable.

PRIOR ART DOCUMENT

J. Org. Chem., 1990, 55(9), pp. 2968-2969; Chemistry of Materials, 1994, 6(7), pp. 935-942.

DISCLOSURE OF THE INVENTION

Problems to be Solved by the Invention

The present disclosure provides an aluminum compound, an aluminum-containing film-forming precursor composition including the aluminum compound, and a method of forming an aluminum-containing film using the aluminum-containing film-forming precursor composition.

In particular, the present disclosure provides an aluminum precursor compound, a method of preparing the same and a precursor composition including the aluminum precursor compound by which the GPC per gas supply cycle is constant despite a change in deposition temperature in an atomic layer deposition method for sequentially supplying a raw material and a reaction gas, or it is advantageous in readily controlling the thickness of an extremely thin aluminum-containing film with a thickness of several nm or less due to a low GPC per gas supply cycle.

However, problems to be solved by the present disclosure are not limited to the above-described problems. Although not described herein, other problems to be solved by the present disclosure can be clearly understood by a person with ordinary skill in the art from the following description.

Means for Solving the Problems

A first aspect of the present disclosure provides an aluminum precursor compound, represented by Chemical Formula selected from the following Chemical Formula I to Chemical Formula IV:

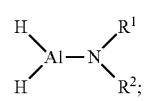

[Chemical Formula I]

in the above Chemical Formula I,
each of $R^1$ and $R^2$ is independently a substituted or unsubstituted linear or branched $C_{1-5}$ alkyl group and is substituted with a linear or branched $C_{2-6}$ dialkylamino group or $C_{3-6}$ cyclic amino group when substituted;

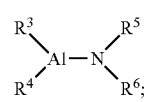

[Chemical Formula II]

in the above Chemical Formula II,
each of $R^3$ and $R^4$ is independently hydrogen, a linear or branched $C_{1-3}$ alkyl group, or a linear or branched $C_{2-6}$ dialkylamino group,
$R^5$ is a linear or branched $C_{1-5}$ alkyl group, and
$R^6$ is a linear or branched $C_{1-5}$ alkyl group substituted with a linear or branched $C_{2-6}$ dialkylamino group or a $C_{3-6}$ cyclic amino group;

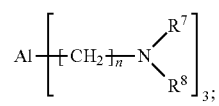

[Chemical Formula III]

in the above Chemical Formula III,
each of $R^7$ and $R^8$ is independently a substituted or unsubstituted linear or branched $C_{1-5}$ alkyl group and is substituted with a linear or branched $C_{2-6}$ dialkylamino group or $C_{3-6}$ cyclic amino group when substituted, and
n is an integer of 1 to 3; and

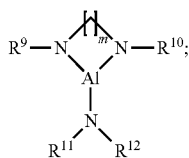

[Chemical Formula IV]

in the above Chemical Formula IV, each of $R^9$ and $R^{10}$ is independently a linear or branched $C_{1-4}$ alkyl group, each of $R^{11}$ and $R^{12}$ is independently a substituted or unsubstituted linear or branched $C_{1-4}$ alkyl group or —$CR^a$=$NR^b$ and is substituted with a linear or branched $C_{2-6}$ dialkylamino group or $C_{3-6}$ cyclic amino group when substituted, each of $R^a$ and $R^b$ is independently hydrogen or a linear or branched $C_{1-3}$ alkyl group, and m is an integer of 1 to 3.

A second aspect of the present disclosure provides a precursor composition for forming an aluminum-containing film, including an aluminum precursor compound according to the first aspect.

A third aspect of the present disclosure provides a method of forming an aluminum-containing film, including forming an aluminum-containing film using a precursor composition for forming an aluminum-containing film including an aluminum precursor compound according to the first aspect.

Effects of the Invention

A composition for forming a film including an aluminum precursor according to the embodiments of the present disclosure can be easily vaporized and has high thermal stability. Thus, it is advantageous in forming an aluminum-containing film by a chemical vapor deposition method or an atomic layer deposition method.

According to the embodiments of the present disclosure, the growth-per-cycle per gas supply cycle is constant in the atomic layer deposition method even when the deposition temperature is changed. Thus, it is advantageous in precisely controlling the film thickness when an aluminum-containing film is formed.

In particular, the growth-per-cycle per gas supply cycle is low in the atomic layer deposition method. Thus, it is advantageous in precisely controlling the film thickness when a thin film with a thickness of several nm or less is formed.

BRIEF DESCRIPTION OF THE DRAWINGS

FIG. 1 is a graph showing the growth-per-cycle per gas supply cycle depending on the deposition temperature of aluminum oxide films prepared by plasma enhanced atomic layer deposition (PEALD) according to Example 8 of the present disclosure.

FIG. 2 is a graph showing the growth-per-cycle per gas supply cycle depending on the deposition temperature of aluminum oxide films prepared by atomic layer deposition (ALD) according to Example 9 of the present disclosure.

FIG. 3 shows the results of secondary ion mass spectrometry (SIMS) analysis of the aluminum oxide films prepared by PEALD according to Example 8 of the present disclosure.

FIG. 4 shows a comparison among the aluminum precursor compounds used herein based on the results of SIMS analysis of the carbon content in the aluminum oxide films prepared by PEALD according to Example 8 of the present disclosure.

BEST MODE FOR CARRYING OUT THE INVENTION

Hereinafter, embodiments and examples of the present disclosure will be described in detail with reference to the accompanying drawings so that the present disclosure may be readily implemented by those skilled in the art. However, it is to be noted that the present disclosure is not limited to the examples but can be embodied in various other ways. In drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element.

Through the whole document, the term "on" that is used to designate a position of one element with respect to another element includes both a case that the one element is adjacent to the other element and a case that any other element exists between these two elements.

Through the whole document, the term "comprises or includes" and/or "comprising or including" used in the document means that one or more other components, steps, operation and/or existence or addition of elements are not excluded in addition to the described components, steps, operation and/or elements unless context dictates otherwise.

Through the whole document, the term "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party.

Through the whole document, the term "step of" does not mean "step for".

Through the whole document, the term "combination of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Through this whole specification, a phrase in the form "A and/or B" means "A or B, or A and B".

Through the whole document, the term "alkyl" or "alkyl group" includes a linear or branched alkyl group having 1 to 12 carbon atoms, 1 to 10 carbon atoms, 1 to 8 carbon atoms, or 1 to 5 carbon atoms and all the possible isomers thereof. For example, the alkyl or alkyl group may include a methyl group (Me), an ethyl group (Et), a n-propyl group ($^n$Pr), an iso-propyl group ($^i$Pr), a n-butyl group ($^n$Bu), an iso-butyl group ($^i$Bu), a tert-butyl group ($^t$Bu), a sec-butyl group ($^{sec}$Bu), a n-pentyl group ($^n$Pe), an iso-pentyl group ($^{iso}$Pe), a sec-pentyl group ($^{sec}$Pe), a tert-pentyl group ($^t$Pe), a neo-pentyl group ($^{neo}$Pe), a 3-pentyl group, a n-hexyl group, an iso-hexyl group, a heptyl group, a 4,4-dimethyl pentyl group, an octyl group, a 2,2,4-trimethyl pentyl group, a nonyl group, a decyl group, an undecyl group, a dodecyl group, and isomers thereof, but may not be limited thereto.

Through the whole document, the term "film" means "a film or thin film".

Hereinafter, embodiments of the present disclosure have been described in detail, but the present disclosure may not be limited thereto.

A first aspect of the present disclosure provides an aluminum precursor compound, represented by Chemical Formula selected from the following Chemical Formula I to Chemical Formula IV:

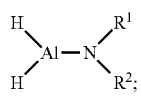

[Chemical Formula I]

in the above Chemical Formula I, each of $R^1$ and $R^2$ is independently a substituted or unsubstituted linear or branched $C_{1-5}$ alkyl group and is substituted with a linear or branched $C_{2-6}$ dialkylamino group or $C_{3-6}$ cyclic amino group when substituted;

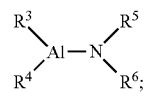

[Chemical Formula II]

in the above Chemical Formula II, each of $R^3$ and $R^4$ is independently hydrogen, a linear or branched $C_{1-3}$ alkyl group, or a linear or branched $C_{2-6}$ dialkylamino group, $R^5$ is a linear or branched $C_{1-5}$ alkyl group, and $R^6$ is a linear or branched $C_{1-5}$ alkyl group substituted with a linear or branched $C_{2-6}$ dialkylamino group or a $C_{3-6}$ cyclic amino group;

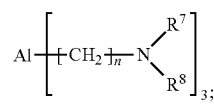

[Chemical Formula III]

in the above Chemical Formula III, each of $R^7$ and $R^8$ is independently a substituted or unsubstituted linear or branched $C_{1-5}$ alkyl group and is substituted with a linear or branched $C_{2-6}$ dialkylamino group or $C_{3-6}$ cyclic amino group when substituted, and n is an integer of 1 to 3; and

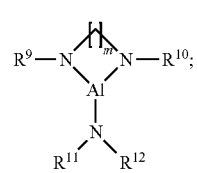

[Chemical Formula IV]

in the above Chemical Formula IV, each of $R^9$ and $R^{10}$ is independently a linear or branched $C_{1-4}$ alkyl group, each of $R^{11}$ and $R^{12}$ is independently a substituted or unsubstituted linear or branched $C_{1-4}$ alkyl group or $-CR^a=NR^b$ and is substituted with a linear or branched $C_{2-6}$ dialkylamino group or $C_{3-6}$ cyclic amino group when substituted, each of $R^a$ and $R^b$ is independently hydrogen or a linear or branched $C_{1-3}$ alkyl group, and m is an integer of 1 to 3.

In an embodiment of the present disclosure, in the above Chemical Formula I, Chemical Formula II and Chemical Formula III, each of $R^1$, $R^2$, $R^5$, $R^6$, $R^7$ and $R^8$ may be independently a substituted or unsubstituted methyl group, ethyl group, n-propyl group, iso-propyl group, n-butyl group, iso-butyl group, sec-butyl group or tert-butyl group, and each of $R^3$ and $R^4$ may be independently hydrogen, methyl group, ethyl group, n-propyl group, iso-propyl group, dimethylamino group, diethylamino group or dipropylamino group, but may not be limited thereto.

In an embodiment of the present disclosure, the linear or branched $C_{2-6}$ dialkylamino group that is independently included in each of $R^1$, $R^2$, $R^5$, $R^6$, $R^7$ and $R^8$ of Chemical Formula I, Chemical Formula II and Chemical Formula III and can be substituted for the linear or branched $C_{1-5}$ alkyl group may be dimethylamino group, diethylamino group or dipropylamino group, and the $C_{3-6}$ cyclic amino group that can be substituted for the linear or branched $C_{1-5}$ alkyl group may be pyrrolidinyl group, piperidinyl group, 2,6-dimethylpiperidinyl group or 4-methylpiperazinyl group, but may not be limited thereto. In an embodiment of the present disclosure, the linear or branched $C_{2-6}$ dialkylamino group that is independently included in each of $R^1$, $R^2$, $R^5$, $R^6$, $R^7$ and $R^8$ of Chemical Formula I, Chemical Formula II and Chemical Formula III and can be substituted for the linear or branched $C_{1-5}$ alkyl group may be dimethylamino group, diethylamino group or dipropylamino group, and the $C_{3-6}$ cyclic amino group that can be substituted for the linear or branched $C_{1-5}$ alkyl group may be pyrrolidinyl group, piperidinyl group, 2,6-dimethylpiperidinyl group or 4-methylpiperazinyl group.

In an embodiment of the present disclosure, in the above Chemical Formula I, Chemical Formula II and Chemical Formula III, each of $R^1$, $R^2$, $R^5$, $R^6$, $R^7$ and $R^8$ may be independently methyl group, ethyl group, n-propyl group, iso-propyl group, n-butyl group, iso-butyl group, sec-butyl group, tert-butyl group, 2-pyrrolidinylethyl group, 2-piperidinylethyl group, 3-pyrrolidinylpropyl group, 3-piperidinylpropyl group, 2-dimethylamino ethyl group, or 3-dimethylaminopropyl group.

In an embodiment of the present disclosure, in the above Chemical Formula I, Chemical Formula II and Chemical Formula III, each of $R^3$ and $R^4$ may be independently hydrogen, methyl group, or dimethylamino group.

In an embodiment of the present disclosure, in the above Chemical Formula IV, each of $R^9$ and $R^{10}$ may be independently methyl group, ethyl group, n-propyl group, iso-propyl group, n-butyl group, iso-butyl group, sec-butyl group or tert-butyl group, and each of $R^{11}$ and $R^{12}$ may be independently a substituted or unsubstituted methyl group, ethyl group, n-propyl group, iso-propyl group, n-butyl group, iso-butyl group, sec-butyl group, tert-butyl group, $-C(CH_3)=N-CH_3$, $-C(CH_3)=N-CH_2CH_3$ or $-C(CH_3)=N-CH(CH_3)_2$, but may not be limited thereto.

In an embodiment of the present disclosure, in the above Chemical Formula IV, each of $R^9$ and $R^{10}$ may be independently methyl group, ethyl group, n-propyl group, or iso-propyl group.

In an embodiment of the present disclosure, the linear or branched $C_{2-6}$ dialkylamino group that is independently included in each of $R^{11}$ and $R^{12}$ of Chemical Formula IV and can be substituted for the linear or branched $C_{1-4}$ alkyl group may be dimethylamino group, diethylamino group or dipropylamino group, and the $C_{3-6}$ cyclic amino group that can be substituted for the linear or branched $C_{1-5}$ alkyl group may be pyrrolidinyl group, piperidinyl group, 2,6-dimethylpiperidinyl group or 4-methylpiperazinyl group, but may not be limited thereto.

In an embodiment of the present disclosure, in the above Chemical Formula IV, the linear or branched $C_{2-6}$ dialkylamino group that can be substituted for the linear or branched $C_{1-4}$ alkyl group may be dimethylamino group, and the $C_{3-6}$ cyclic amino group that can be substituted for the linear or branched $C_{1-5}$ alkyl group may be pyrrolidinyl group, piperidinyl group, 2,6-dimethylpiperidinyl group or 4-methylpiperazinyl group.

In an embodiment of the present disclosure, in the above Chemical Formula IV, each of $R^{11}$ and $R^{12}$ may be independently methyl group, ethyl group, n-propyl group, iso-propyl group, 2-dimethylamino ethyl group, 3-dimethylamino propyl group, —C(CH$_3$)=N—CH$_3$, —C(CH$_3$)=N—CH$_2$CH$_3$ or —C(CH$_3$)=N—CH(CH$_3$)$_2$.

In an embodiment of the present disclosure, the aluminum precursor compound may include the following compounds:

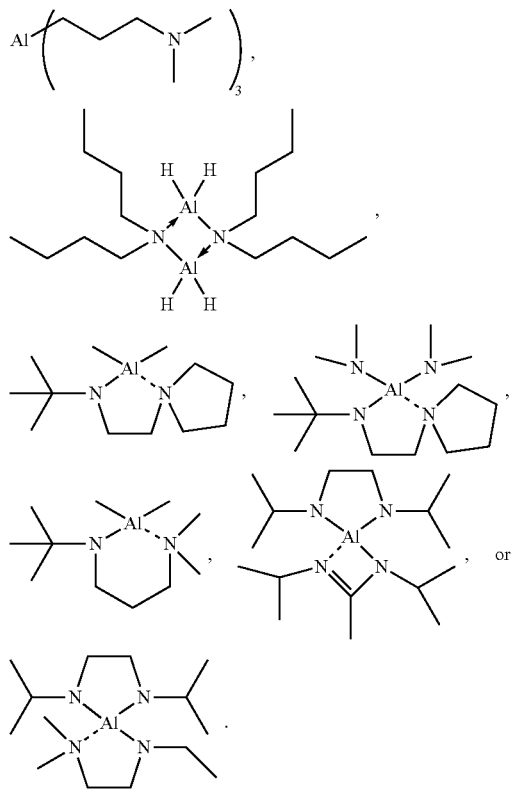

In an embodiment of the present disclosure, there may be provided a method of preparing an aluminum precursor compound, including reacting AlH$_3$ with HNR$^1$R$^2$ to obtain an aluminum precursor compound represented by the following Chemical Formula I:

[Chemical Formula I]

wherein, in the above Chemical Formula I,
each of $R^1$ and $R^2$ is independently a substituted or unsubstituted linear or branched $C_{1-5}$ alkyl group and is substituted with a linear or branched $C_{2-6}$ dialkylamino group or $C_{3-6}$ cyclic amino group when substituted.

In an embodiment of the present disclosure, there may be provided a method of preparing an aluminum precursor compound, including reacting an intermediate product, which is obtained by reacting AlX$_3$ with MNR$^5$R$^6$, with R$^3$M' and R$^4$M" to obtain an aluminum precursor compound represented by the following Chemical Formula II:

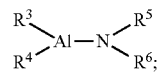

[Chemical Formula II]

in the above Chemical Formula II,
each of $R^3$ and $R^4$ is independently hydrogen, a linear or branched $C_{1-3}$ alkyl group, or a linear or branched $C_{2-6}$ dialkylamino group,
$R^5$ is a linear or branched $C_{1-5}$ alkyl group, $R^6$ is a linear or branched $C_{1-5}$ alkyl group substituted with a linear or branched $C_{2-6}$ dialkylamino group or a $C_{3-6}$ cyclic amino group,
X is a halogen element, and
each of M, M' and M" is independently an alkali metal or alkaline earth metal.

In an embodiment of the present disclosure, there may be provided a method of preparing an aluminum precursor compound, including reacting an intermediate product, which is obtained by reacting AlX$_3$ with XM(CH$_2$)$_n$NR$^7$R$^8$, with (CH$_2$)$_n$NR$^7$R$^8$M' and (CH$_2$)$_n$NR$^9$R$^{10}$M" to obtain an aluminum precursor compound represented by the following Chemical Formula III:

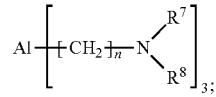

[Chemical Formula III]

in the above Chemical Formula III,
each of $R^7$ and $R^8$ is independently a substituted or unsubstituted linear or branched $C_{1-5}$ alkyl group and is substituted with a linear or branched $C_{2-6}$ dialkylamino group or $C_{3-6}$ cyclic amino group when substituted,
n is an integer of 1 to 3, and
X is a halogen element, and
each of M, M' and M" is independently an alkali metal or alkaline earth metal.

In an embodiment of the present disclosure, X may be at least one selected from Cl, Br, and I, and the alkali metal or alkaline earth metal may be at least one selected from Li, Na, K, and Mg, but may not be limited thereto.

In an embodiment of the present disclosure, the aluminum compounds represented by Chemical Formula I, Chemical Formula II and Chemical Formula III may be prepared without limitation by a known method, but desirably, the aluminum compounds may be obtained by optionally substituting anamine group or an alkyl group in a polar solvent or a non-polar solvent, followed by purification, but may not be limited thereto.

In an embodiment of the present disclosure, the aluminum compounds represented by Chemical Formula I, Chemical Formula II and Chemical Formula III may be prepared according to any one of Reaction Formula 1 to Reaction Formula 3 below, but may not be limited thereto:

[Reaction Formula 1]

$3MAlH_4 + AlX_3 \rightarrow 4AlH_3 + 3MX$;  and                                                                   Step 1:

$AlH_3 + HNR^1R^2 \rightarrow H_2Al(NR^1R^2) + H_2\uparrow$;                                                     Step 2:

[Reaction Formula 2]

$^nBuM + HNR^5R^6 \rightarrow M\text{-}NR^5R^6 + ^nBuH$;                                                          Step 1:

$AlX_3 + M\text{-}NR^5R^6 \rightarrow X_2Al\text{-}NR^5R^6 + MX$;  and                                                 Step 2:

$X_2Al\text{-}NR^5R^6 + R^3M' + R^4M'' \rightarrow R^3R^4Al\text{-}NR^5R^6 + M'X + M''X$;                                         Step 3:

[Reaction Formula 3]

$M + X\text{-}(CH_2)_n\text{-}NR^7R^8 \rightarrow XM\text{-}(CH_2)_n\text{-}NR^7R^8$;                                            Step 1:

$AlX_3 + 3XM\text{-}(CH_2)_n\text{-}NR^7R^8 \rightarrow Al[(CH_2)_n\text{-}NR^7R^8]_3 + 3MX_2$;  and                                Step 2:

In an embodiment of the present disclosure, the following compounds may be prepared by the above-described method of preparing an aluminum precursor compound:

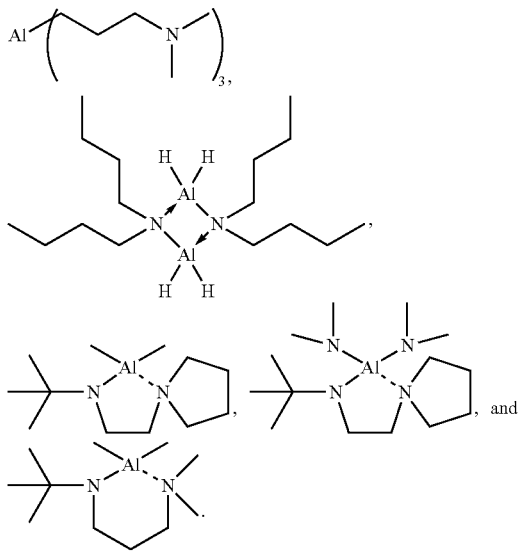

In an embodiment of the present disclosure, there may be provided a method of preparing an aluminum precursor compound, including reacting an intermediate product, which is obtained by reacting $AlX_3$ with $MNR^{11}R^{12}$, with $M'R^9N(CH_2)_mNR^{10}M'$ to obtain an aluminum precursor compound represented by the following Chemical Formula IV:

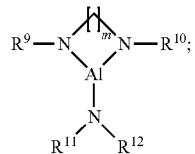

[Chemical Formula IV]

in the above Chemical Formula IV, each of $R^9$ and $R^{10}$ is independently a linear or branched $C_{1-4}$ alkyl group, each of $R^{11}$ and $R^{12}$ is independently a substituted or unsubstituted linear or branched $C_{1-4}$ alkyl group or $-CR^a=NR^b$ and is substituted with a linear or branched $C_{2-6}$ dialkylamino group or $C_{3-6}$ cyclic amino group when substituted, each of $R^a$ and $R^b$ is independently hydrogen or a linear or branched $C_{1-3}$ alkyl group, m is an integer of 1 to 3, and X is a halogen element, and each of M and M' is independently an alkali metal or alkaline earth metal.

In an embodiment of the present disclosure, X may be at least one selected from Cl, Br, and I, and the alkali metal or alkaline earth metal may be at least one selected from Li, Na, K, and Mg, but may not be limited thereto.

In an embodiment of the present disclosure, the aluminum compound represented by Chemical Formula IV may be prepared without limitation by a known method, but desirably, the aluminum compound may be obtained by optionally substituting anamine group or analkyl group in a polar solvent or a non-polar solvent, followed by purification, but may not be limited thereto.

In an embodiment of the present disclosure, the aluminum compound represented by Chemical Formula IV may be prepared according to Reaction Formula 4 or Reaction Formula 5 below, but may not be limited thereto:

[Reaction Formula 4] (For example, if $R^{12}$ is $-CR^a=NR^b$)

$R^bN=C=NR^{11} + R^aM \rightarrow [R^bN=CR^a-NR^{11}]M$;                                          Step 1:

$AlX_3 + [R^bN=CR^a-NR^{11}]M \rightarrow [R^bN=CR^a-NR^{11}]AlX_2 + MX$;                                   Step 2:

$R^9NH(CH_2)_mNHR^{10} + 2^nBuM' \rightarrow M'-NR^9(CH_2)_mNR^{10}-M' + 2^nBuH$;  and                           Step 3:

$M'-NR^9(CH_2)_mNR^{10} + M' + [R^bN=CR^a-NR^{11}]AlX_2 \rightarrow [R^bN=CR^a-NR^{11}]Al[NR^9(CH_2)_mNR^{10}] + 2M'X$                           Step 4:

[Reaction Formula 5] (For example, if $R^{12}$ is not $-CR^a=NR^b$)

$R^9NH(CH_2)_mNHR^{10} + 2^nBuM \rightarrow M\text{-}NR^9(CH_2)_mNR^{10}\text{-}M + 2^nBuH$;                              Step 1:

$AlX_3 + M\text{-}NR^9(CH_2)_mNR^{10}\text{-}M \rightarrow [NR^9(CH_2)_mNR^{10}]AlX + 2MX$;                                 Step 2:

$H\text{-}NR^{11}R^{12} + ^nBuM' \rightarrow M'\text{-}NR^{11}R^{12} + ^nBuH$;  and                                         Step 3:

$[NR^9(CH_2)_mNR^{10}]AlX + M'\text{-}NR^{11}R^{12} \rightarrow [NR^9(CH_2)_mNR^{10}]Al\text{-}NR^{11}R^{12} + M'X$;                             Step 4:

In an embodiment of the present disclosure, the following compounds may be prepared by the method for preparing the aluminum precursor compound:

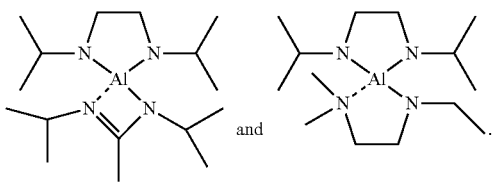 and 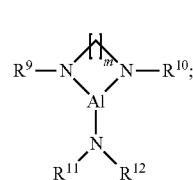

A second aspect of the present disclosure provides a precursor composition for forming an aluminum-containing film, including an aluminum precursor compound according to the first aspect.

Detailed descriptions of the second aspect of the present disclosure, which overlap with those of the first aspect of the present disclosure, are omitted hereinafter, but the descriptions of the first aspect of the present disclosure may be identically applied to the second aspect of the present disclosure, even though they are omitted hereinafter.

In an embodiment of the present disclosure, the aluminum precursor compound may be represented by Chemical Formula selected from the following Chemical Formula I to Chemical Formula IV:

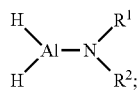

[Chemical Formula I]

in the above Chemical Formula I,
each of $R^1$ and $R^2$ is independently a substituted or unsubstituted linear or branched $C_{1-5}$ alkyl group and is substituted with a linear or branched $C_{2-6}$ dialkylamino group or $C_{3-6}$ cyclic amino group when substituted;

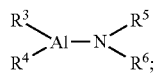

[Chemical Formula II]

in the above Chemical Formula II,
each of $R^3$ and $R^4$ is independently hydrogen, a linear or branched $C_{1-3}$ alkyl group, or a linear or branched $C_{2-6}$ dialkylamino group,
$R^5$ is a linear or branched $C_{1-5}$ alkyl group, and
$R^6$ is a linear or branched $C_{1-5}$ alkyl group substituted with a linear or branched $C_{2-6}$ dialkylamino group or a $C_{3-6}$ cyclic amino group;

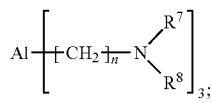

[Chemical Formula III]

in the above Chemical Formula III,
each of $R^7$ and $R^8$ is independently a substituted or unsubstituted linear or branched $C_{1-5}$ alkyl group and is substituted with a linear or branched $C_{2-6}$ dialkylamino group or $C_{3-6}$ cyclic amino group when substituted, and
n is an integer of 1 to 3; and

[Chemical Formula IV]

in the above Chemical Formula IV,
each of $R^9$ and $R^{10}$ is independently a linear or branched $C_{1-4}$ alkyl group,
each of $R^{11}$ and $R^{12}$ is independently a substituted or unsubstituted linear or branched $C_{1-4}$ alkyl group or $-CR^a=NR^b$ and is substituted with a linear or branched $C_{2-6}$ dialkylamino group or $C_{3-6}$ cyclic amino group when substituted,
each of $R^a$ and $R^b$ is independently hydrogen or a linear or branched $C_{1-3}$ alkyl group, and
m is an integer of 1 to 3.

In an embodiment of the present disclosure, in the above Chemical Formula I, Chemical Formula II and Chemical Formula III, each of $R^1$, $R^2$, $R^5$, $R^6$, $R^7$ and $R^8$ may be independently a substituted or unsubstituted methyl group, ethyl group, n-propyl group, iso-propyl group, n-butyl group, iso-butyl group, sec-butyl group or tert-butyl group, and each of $R^3$ and $R^4$ may be independently hydrogen, methyl group, ethyl group, n-propyl group, iso-propyl group, dimethylamino group, diethylamino group or dipropylamino group, but may not be limited thereto.

In an embodiment of the present disclosure, the linear or branched $C_{2-6}$ dialkylamino group that is independently included in each of $R^1$, $R^2$, $R^5$, $R^6$, $R^7$ and $R^8$ of Chemical Formula I, Chemical Formula II and Chemical Formula III and can be substituted for the linear or branched $C_{1-5}$ alkyl group may be dimethylamino group, diethylamino group or dipropylamino group, and the $C_{3-6}$ cyclic amino group that can be substituted for the linear or branched $C_{1-5}$ alkyl group may be pyrrolidinyl group, piperidinyl group, 2,6-dimethylpiperidinyl group or 4-methylpiperazinyl group, but may not be limited thereto. In an embodiment of the present disclosure, the linear or branched $C_{2-6}$ dialkylamino group that is independently included in each of $R^1$, $R^2$, $R^5$, $R^6$, $R^7$ and $R^8$ of Chemical Formula I, Chemical Formula II and Chemical Formula III and can be substituted for the linear or branched $C_{1-5}$ alkyl group may be dimethylamino group, diethylamino group or dipropylamino group, and the $C_{3-6}$ cyclic amino group that can be substituted for the linear or branched $C_{1-5}$ alkyl group may be pyrrolidinyl group, piperidinyl group, 2,6-dimethylpiperidinyl group or 4-methylpiperazinyl group.

In an embodiment of the present disclosure, in the above Chemical Formula I, Chemical Formula II and Chemical Formula III, each of $R^1$, $R^2$, $R^5$, $R^6$, $R^7$ and $R^8$ may be independently methyl group, ethyl group, n-propyl group, iso-propyl group, n-butyl group, iso-butyl group, sec-butyl group, tert-butyl group, 2-pyrrolidinylethyl group, 2-piperidinylethyl group, 3-pyrrolidinylpropyl group, 3-piperidinylpropyl group, 2-dimethylamino ethyl group, or 3-dimethylaminopropyl group.

In an embodiment of the present disclosure, in the above Chemical Formula I, Chemical Formula II and Chemical Formula III, each of $R^3$ and $R^4$ may be independently hydrogen, methyl group, or dimethylamino group.

In an embodiment of the present disclosure, in the above Chemical Formula IV, each of $R^9$ and $R^{10}$ may be independently methyl group, ethyl group, n-propyl group, iso-propyl group, n-butyl group, iso-butyl group, sec-butyl group or tert-butyl group, and each of $R^{11}$ and $R^{12}$ may be independently a substituted or unsubstituted methyl group, ethyl group, n-propyl group, iso-propyl group, n-butyl group, iso-butyl group, sec-butyl group, tert-butyl group, —C(CH$_3$)=N—CH$_3$, —C(CH$_3$)=N—CH$_2$CH$_3$ or —C(CH$_3$)=N—CH(CH$_3$)$_2$, but may not be limited thereto.

In an embodiment of the present disclosure, in the above Chemical Formula IV, each of $R^9$ and $R^{10}$ may be independently methyl group, ethyl group, n-propyl group, or iso-propyl group.

In an embodiment of the present disclosure, the linear or branched $C_{2-6}$ dialkylamino group that is independently included in each of $R^{11}$ and $R^{12}$ of Chemical Formula IV and can be substituted for the linear or branched $C_{1-4}$ alkyl group may be dimethylamino group, diethylamino group or dipropylamino group, and the $C_{3-6}$ cyclic amino group that can be substituted for the linear or branched $C_{1-5}$ alkyl group may be pyrrolidinyl group, piperidinyl group, 2,6-dimethylpiperidinyl group or 4-methylpiperazinyl group, but may not be limited thereto.

In an embodiment of the present disclosure, in the above Chemical Formula IV, the linear or branched $C_{2-6}$ dialkylamino group that can be substituted for the linear or branched $C_{1-4}$ alkyl group may be dimethylamino group, and the $C_{3-6}$ cyclic amino group that can be substituted for the linear or branched $C_{1-5}$ alkyl group may be pyrrolidinyl group, piperidinyl group, 2,6-dimethylpiperidinyl group or 4-methylpiperazinyl group.

In an embodiment of the present disclosure, in the above Chemical Formula IV, each of $R^{11}$ and $R^{12}$ may be independently methyl group, ethyl group, n-propyl group, iso-propyl group, 2-dimethylamino ethyl group, 3-dimethylamino propyl group, —C(CH$_3$)=N—CH$_3$, —C(CH$_3$)=N—CH$_2$CH$_3$ or —C(CH$_3$)=N—CH(CH$_3$)$_2$.

In an embodiment of the present disclosure, the aluminum precursor compounds may include the following compounds:

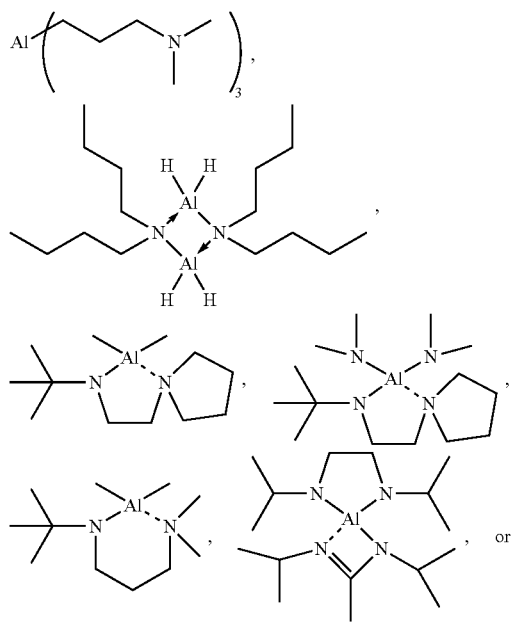

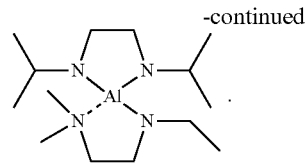

In an embodiment of the present disclosure, the film may be at least one selected from an aluminum-containing metal film, an aluminum-containing oxide film, an aluminum-containing nitride film, an aluminum-containing carbide film, an aluminum-containing oxynitride film and an aluminum-containing carbonitride film, but may not be limited thereto.

In an embodiment of the present disclosure, the aluminum-containing oxide film may be used for a dielectric film, a gate insulating film, a capacitor dielectric film, a storage capacitor dielectric film, an encapsulation oxide film, etc., and the aluminum-containing nitride film may be used for a diffusion barrier film, an electrode, etc., and can be variously applied depending on the purpose of application. However, the present disclosure may not be limited thereto.

In an embodiment of the present disclosure, the film-forming precursor composition may further include at least one nitrogen source selected from ammonia, nitrogen, hydrazine and dimethyl hydrazine, but may not be limited thereto.

In an embodiment of the present disclosure, the film-forming precursor composition may further include at least one oxygen source selected from water vapor, oxygen and ozone, but may not limited thereto.

A third aspect of the present disclosure provides a method of forming an aluminum-containing film, including forming an aluminum-containing film using a precursor composition for forming an aluminum-containing film including an aluminum precursor compound according to the first aspect.

Detailed descriptions of the third aspect of the present disclosure, which overlap with those of the first aspect and the second aspect of the present disclosure, are omitted hereinafter, but the descriptions of the first aspect and the second aspect of the present disclosure may be identically applied to the third aspect of the present disclosure, even though they are omitted hereinafter.

In an embodiment of the present disclosure, the aluminum precursor compound may be represented by Chemical Formula selected from the following Chemical Formula I to Chemical Formula IV:

[Chemical Formula I]

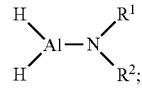

in the above Chemical Formula I,
each of $R^1$ and $R^2$ is independently a substituted or unsubstituted linear or branched $C_{1-5}$ alkyl group and is substituted with a linear or branched $C_{2-6}$ dialkylamino group or $C_{3-6}$ cyclic amino group when substituted;

[Chemical Formula II]

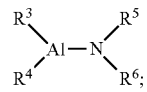

in the above Chemical Formula II,
each of $R^3$ and $R^4$ is independently hydrogen, a linear or branched $C_{1-3}$ alkyl group, or a linear or branched $C_{2-6}$ dialkylamino group,
$R^5$ is a linear or branched $C_{1-5}$ alkyl group, and
$R^6$ is a linear or branched $C_{1-5}$ alkyl group substituted with a linear or branched $C_{2-6}$ dialkylamino group or a $C_{3-6}$ cyclic amino group;

[Chemical Formula III]

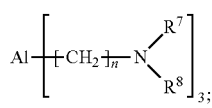

in the above Chemical Formula III,
each of $R^7$ and $R^8$ is independently a substituted or unsubstituted linear or branched $C_{1-5}$ alkyl group and is substituted with a linear or branched $C_{2-6}$ dialkylamino group or $C_{3-6}$ cyclic amino group when substituted, and
n is an integer of 1 to 3; and

[Chemical Formula IV]

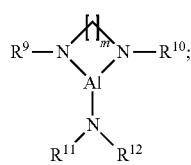

in the above Chemical Formula IV,
each of $R^9$ and $R^{10}$ is independently a linear or branched $C_{1-4}$ alkyl group,
each of $R^{11}$ and $R^{12}$ is independently a substituted or unsubstituted linear or branched $C_{1-4}$ alkyl group or —$CR^a$=$NR^b$ and is substituted with a linear or branched $C_{2-6}$ dialkylamino group or $C_{3-6}$ cyclic amino group when substituted,
each of $R^a$ and $R^b$ is independently hydrogen or a linear or branched $C_{1-3}$ alkyl group, and
m is an integer of 1 to 3.

In an embodiment of the present disclosure, wherein, in the above Chemical Formula I, Chemical Formula II and Chemical Formula III, each of $R^1$, $R^2$, $R^5$, $R^6$, $R^7$ and $R^8$ may be independently a substituted or unsubstituted methyl group, ethyl group, n-propyl group, iso-propyl group, n-butyl group, iso-butyl group, sec-butyl group or tert-butyl group, and each of $R^3$ and $R^4$ may be independently hydrogen, methyl group, ethyl group, n-propyl group, iso-propyl group, dimethylamino group, diethylamino group or dipropylamino group, but may not be limited thereto.

In an embodiment of the present disclosure, the linear or branched $C_{2-6}$ dialkylamino group that is independently included in each of $R^1$, $R^2$, $R^5$, $R^6$, $R^7$ and $R^8$ of Chemical Formula I, Chemical Formula II and Chemical Formula III and can be substituted for the linear or branched $C_{1-5}$ alkyl group may be dimethylamino group, diethylamino group or dipropylamino group, and the $C_{3-6}$ cyclic amino group that can be substituted for the linear or branched $C_{1-5}$ alkyl group may be pyrrolidinyl group, piperidinyl group, 2,6-dimethylpiperidinyl group or 4-methylpiperazinyl group, but may not be limited thereto.

In an embodiment of the present disclosure, the linear or branched $C_{2-6}$ dialkylamino group that is independently included in each of $R^1$, $R^2$, $R^5$, $R^6$, $R^7$ and $R^8$ of Chemical Formula I, Chemical Formula II and Chemical Formula III and can be substituted for the linear or branched $C_{1-5}$ alkyl group may be dimethylamino group, diethylamino group or dipropylamino group, and the $C_{3-6}$ cyclic amino group that can be substituted for the linear or branched $C_{1-5}$ alkyl group may be pyrrolidinyl group, piperidinyl group, 2,6-dimethylpiperidinyl group or 4-methylpiperazinyl group.

In an embodiment of the present disclosure, wherein, in the above Chemical Formula I, Chemical Formula II and Chemical Formula III, each of $R^1$, $R^2$, $R^5$, $R^6$, $R^7$ and $R^8$ may be independently a substituted or unsubstituted methyl group, ethyl group, n-propyl group, iso-propyl group, n-butyl group, iso-butyl group, sec-butyl group, tert-butyl group, 2-pyrrolidinylethyl group, 2-piperidinylethyl group, 3-pyrrolidinylpropyl group, 3-piperidinylpropyl group, 2-dimethylaminoethyl group, or 3- dimethylaminopropyl group.

In an embodiment of the present disclosure, wherein, in the above Chemical Formula I, Chemical Formula II and Chemical Formula III, each of $R^3$ and $R^4$ may be independently hydrogen, methyl group, or dimethylamino group.

In an embodiment of the present disclosure, wherein, in the above Chemical Formula IV, each of $R^9$ and $R^{10}$ may be independently methyl group, ethyl group, n-propyl group, iso-propyl group, n-butyl group, iso-butyl group, sec-butyl group or tert-butyl group, and each of $R^{11}$ and $R^{12}$ may be independently a substituted or unsubstituted methyl group, ethyl group, n-propyl group, iso-propyl group, n-butyl group, iso-butyl group, sec-butyl group, tert-butyl group, —C(CH$_3$)=N—CH$_3$, —C(CH$_3$)=N—CH$_2$CH$_3$ or —C(CH$_3$)=N—CH(CH$_3$)$_2$, but may not be limited thereto.

In an embodiment of the present disclosure, wherein, in the above Chemical Formula IV, each of $R^9$ and $R^{10}$ may be independently methyl group, ethyl group, n-propyl group, or iso-propyl group.

In an embodiment of the present disclosure, the linear or branched $C_{2-6}$ dialkylamino group that is independently included in each of $R^{11}$ and $R^{12}$ of Chemical Formula IV and can be substituted for the linear or branched $C_{1-4}$ alkyl group may be dimethylamino group, diethylamino group or dipropylamino group, and the $C_{3-6}$ cyclic amino group that can be substituted for the linear or branched $C_{1-5}$ alkyl group may be pyrrolidinyl group, piperidinyl group, 2,6-dimethylpiperidinyl group or 4-methylpiperazinyl group, but may not be limited thereto.

In an embodiment of the present disclosure, wherein, in the above Chemical Formula IV, the linear or branched $C_{2-6}$ dialkylamino group that can be substituted for the linear or branched $C_{1-4}$ alkyl group may be dimethylamino group, and the $C_{3-6}$ cyclic amino group that can be substituted for the linear or branched $C_{1-5}$ alkyl group may be pyrrolidinyl group, piperidinyl group, 2,6-dimethylpiperidinyl group or 4-methylpiperazinyl group.

In an embodiment of the present disclosure, wherein, in the above Chemical Formula IV, each of $R^{11}$ and $R^{12}$ may be independently methyl group, ethyl group, n-propyl group, iso-propyl group, 2-dimethylamino ethyl group, 3-dimethylamino propyl group, —C(CH$_3$)=N—CH$_3$, —C(CH$_3$)=N—CH$_2$CH$_3$ or —C(CH$_3$)=N—CH(CH$_3$)$_2$.

In an embodiment of the present disclosure, the aluminum precursor compounds may include the following compounds:

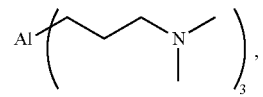

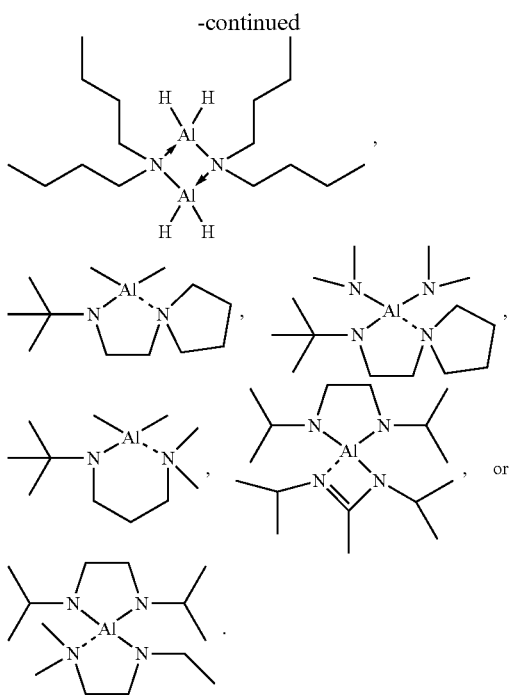

In an embodiment of the present disclosure, the film may be at least one selected from an aluminum-containing metal film, an aluminum-containing oxide film, an aluminum-containing nitride film, an aluminum-containing carbide film, an aluminum-containing oxynitride film and an aluminum-containing carbonitride film, but may not be limited thereto.

In an embodiment of the present disclosure, the aluminum-containing film may be deposited by chemical vapor deposition (CVD) or atomic layer deposition (ALD), but may not be limited thereto. The aluminum-containing film may be deposited by metal organic chemical vapor deposition (MOCVD) or atomic layer deposition (ALD), but may not be limited thereto. Further, the chemical vapor deposition or the atomic layer deposition may be performed using a deposition apparatus known in the art, deposition conditions and an additional reaction gas, but may not be limited thereto.

In an embodiment of the present disclosure, the aluminum-containing film may be formed in a temperature range of about 100° C. to about 500° C., but may not be limited thereto. For example, the aluminum-containing film may be formed in a temperature range of about 100° C. to about 500° C., about 100° C. to about 450° C., about 100° C. to about 400° C., about 100° C. to about 350° C., about 100° C. to about 300° C., about 100° C. to about 250° C., about 100° C. to about 200° C., about 100° C. to about 150° C., about 150° C. to about 500° C., about 150° C. to about 450° C., about 150° C. to about 400° C., about 150° C. to about 350° C., about 150° C. to about 300° C., about 150° C. to about 250° C., about 150° C. to about 200° C., about 200° C. to about 500° C., about 200° C. to about 450° C., about 200° C. to about 400° C., about 200° C. to about 350° C., about 200° C. to about 300° C., about 200° C. to about 250° C., about 250° C. to about 500° C., about 250° C. to about 450° C., about 250° C. to about 400° C., about 250° C. to about 350° C., about 250° C. to about 300° C., about 300° C. to about 500° C., about 300° C. to about 450° C., about 300° C. to about 400° C., about 300° C. to about 350° C., about 350° C. to about 500° C., about 350° C. to about 450° C., about 350° C. to about 400° C., about 400° C. to about 500° C., about 400° C. to about 450° C., or about 450° C. to about 500° C., but may not be limited thereto. In the embodiments of the present disclosure, the aluminum-containing film may be formed in a temperature range of about 250° C. to about 450° C.

In the embodiments of the present disclosure, the thickness of the aluminum-containing film may be about 1 nm to about 500 nm and can be variously applied depending on the purpose of application, but may not be limited thereto. For example, the thickness of the aluminum-containing film may be about 1 nm to about 500 nm, about 1 nm to about 400 nm, about 1 nm to about 300 nm, about 1 nm to about 200 nm, about 1 nm to about 100 nm, about 1 nm to about 50 nm, about 1 nm to about 40 nm, about 1 nm to about 30 nm, about 1 nm to about 20 nm, about 1 nm to about 10 nm, about 10 nm to about 500 nm, about 10 nm to about 400 nm, about 10 nm to about 300 nm, about 10 nm to about 200 nm, about 10 nm to about 100 nm, about 10 nm to about 50 nm, about 10 nm to about 40 nm, about 10 nm to about 30 nm, about 10 nm to about 20 nm, about 20 nm to about 500 nm, about 20 nm to about 400 nm, about 20 nm to about 300 nm, about 20 nm to about 200 nm, about 20 nm to about 100 nm, about 20 nm to about 50 nm, about 20 nm to about 40 nm, about 20 nm to about 30 nm, about 30 nm to about 500 nm, about 30 nm to about 400 nm, about 30 nm to about 300 nm, about 30 nm to about 200 nm, about 30 nm to about 100 nm, about 30 nm to about 50 nm, about 30 nm to about 40 nm, about 40 nm to about 500 nm, about 40 nm to about 400 nm, about 40 nm to about 300 nm, about 40 nm to about 200 nm, about 40 nm to about 100 nm, about 40 nm to about 50 nm, about 50 nm to about 500 nm, about 50 nm to about 400 nm, about 50 nm to about 300 nm, about 50 nm to about 200 nm, about 50 nm to about 100 nm, about 100 nm to about 500 nm, about 100 nm to about 400 nm, about 100 nm to about 300 nm, about 100 nm to about 200 nm, about 200 m to about 500 nm, about 200 nm to about 400 nm, about 200 nm to about 300 nm, about 300 nm to about 500 nm, about 300 nm to about 400 nm, or about 400 nm to about 500 nm, but may not be limited thereto.

In an embodiment of the present disclosure, the aluminum-containing film may be formed on at least one substrate selected from typical silicon semiconductor wafers, compound semiconductor wafers and plastic substrates (PI, PET, PES, and PEN), but may not be limited thereto. Further, a substrate including holes or grooves(trenches) may be used, or a porous substrate having a large surface area may be used, but may not be limited thereto. Also, the aluminum-containing film may be simultaneously or sequentially formed on all or part of a substrate in which two or more different substrates are contacted or connected with each other, but may not be limited thereto.

In an embodiment of the present disclosure, the aluminum-containing film may be formed on a substrate including a trench with an aspect ratio of about 1 or more and a width of about 1 μm or less, but may not be limited thereto. For example, the aspect ratio may be about 1 to about 50, about 1 to about 40, about 1 to about 30, about 1 to about 20, about 1 to about 10, about 10 to about 50, about 10 to about 40, about 10 to about 30, about 10 to about 20, about 20 to about 50, about 20 to about 40, about 20 to about 30, about 30 to about 50, about 30 to about 40, or about 40 to about 50, but may not be limited thereto. Also, for example, the width may be about 10 nm to about 1 μm, about 10 nm to about 900 nm, about 10 nm to about 800 nm, about 10 nm to about 700 nm, about 10 nm to about 600 nm, about 10 nm to about 500 nm, about 10 nm to about 400 nm, about 10 nm to about 300 nm, about 10 nm to about 200 nm, about 10 nm to about 100 nm, about 10 nm to about 90 nm, about 10 nm to about 80 nm, about 10 nm to about 70 nm, about 10 nm to about 60 nm, about 10 to about 50 nm, about 10 nm to about 40 nm, about 10 nm to about 30 nm, about 10 nm to about 20 nm, about 20 nm to about 1 μm, about 20 nm to about 900 nm, about 20 nm to about 800 nm, about 20 nm to about 700 nm, about 20 nm to about 600 nm, about 20 nm to about 500 nm, about 20 nm to about 400 nm, about 20 nm to about 300 nm, about 20 nm to about 200 nm, about 20 nm to about 100 nm, about 20 nm to about 90 nm, about 20 nm to about 80 nm, about 20 nm to about 70 nm, about 20 nm to about 60 nm, about 20 to about 50 nm, about 20 nm to about 40 nm, about 20 nm to about 30 nm, about 30 nm to about 1 μm, about 30 nm to about 900 nm, about 30 nm to about 800 nm, about 30 nm to about 700 nm, about 30 nm to about 600 nm, about 30 nm to about 500 nm, about 30 nm to about 400 nm, about 30 nm to about 300 nm, about 30 nm to about 200 nm, about 30 nm to about 100 nm, about 30 nm to about 90 nm, about 30 nm to about 80 nm, about 30 nm to about 70 nm, about 30 nm to about 60 nm, about 30 to about 50 nm, about 30 nm to about 40 nm, about 40 nm to about 1 μm, about 40 nm to about 900 nm, about 40 nm to about 800 nm, about 40 nm to about 700 nm, about 40 nm to about 600 nm, about 40 nm to about 500 nm, about 40 nm to about 400 nm, about 40 nm to about 300 nm, about 40 nm to about 200 nm, about 40 nm to about 100 nm, about 40 nm to about 90 nm, about 40 nm to about 80 nm, about 40 nm to about 70 nm, about 40 nm to about 60 nm, about 40 to about 50 nm, about 50 nm to about 1 μm, about 50 nm to about 900 nm, about 50 nm to about 800 nm, about 50 nm to about 700 nm, about 50 nm to about 600 nm, about 50 nm to about 500 nm, about 50 nm to about 400 nm, about 50 nm to about 300 nm, about 50 nm to about 200 nm, about 50 nm to about 100 nm, about 50 nm to about 90 nm, about 50 nm to about 80 nm, about 50 nm to about 70 nm, about 50 nm to about 60 nm, about 100 nm to about 1 μm, about 100 nm to about 900 nm, about 100 nm to about 800 nm, about 100 nm to about 700 nm, about 100 nm to about 600 nm, about 100 nm to about 500 nm, about 100 nm to about 400 nm, about 100 nm to about 300 nm, about 100 nm to about 200 nm, about 200 nm to about 1 μm, about 200 nm to about 900 nm, about 200 nm to about 800 nm, about 200 nm to about 700 nm, about 200 nm to about 600 nm, about 200 nm to about 500 nm, about 200 nm to about 400 nm, about 200 nm to about 300 nm, about 300 nm to about 1 μm, about 300 nm to about 900 nm, about 300 nm to about 800 nm, about 300 nm to about 700 nm, about 300 nm to about 600 nm, about 300 nm to about 500 nm, about 300 nm to about 400 nm, about 400 nm to about 1 μm, about 400 nm to about 900 nm, about 400 nm to about 800 nm, about 400 nm to about 700 nm, about 400 nm to about 600 nm, about 400 nm to about 500 nm, about 500 nm to about 1 μm, about 500 nm to about 900 nm, about 500 nm to about 800 nm, about 500 nm to about 700 nm, about 500 nm to about 600 nm, about 600 nm to about 1 μm, about 600 nm to about 900 nm, about 600 nm to about 800 nm, about 600 nm to about 700 nm, about 700 nm to about 1 μm, about 700 nm to about 900 nm, about 700 nm to about 800 nm, about 800 nm to about 1 μm, about 800 nm to about 900 nm, or about 900 nm to about 1 μm, but may not be limited thereto.

In an embodiment of the present disclosure, the aluminum precursor compound of the present disclosure included in the precursor composition for forming a film can be used as a precursor for atomic layer deposition or chemical vapor deposition due to its low density and high thermal stability, and thus, an aluminum-containing oxide thin film can be formed. In particular, even on a substrate having a pattern (groove or trench) on the surface, a porous substrate, or a plastic substrate, an aluminum-containing oxide thin film having a thickness of several μm to several tens of nm can be uniformly formed in a temperature range of about 100° C. to about 500° C., or about 250° C. to about 450° C. An aluminum-containing oxide thin film or nitride thin film having a thickness of several μm to several tens of nm can be uniformly formed on the entire surface of the substrate including a surface of a micro pattern (groove or trench) having an aspect ratio of about 1 to about 50 or more and a width of about 1 μm to about 10 nm, including a surface of the deepest portion of the micro pattern (groove) and an upper surface of the micro pattern (groove or trench).

In an embodiment of the present disclosure, in the method of forming an aluminum-containing film, desirably, a substrate is accommodated inside a reaction chamber and the aluminum precursor compound is transferred onto the substrate using a carrier gas or a dilution gas to deposit an aluminum-containing oxide thin film or nitride thin film in a wide deposition temperature range of about 100° C. to about 500° C. or about 250° C. to about 450° C. However, the present disclosure may not be limited thereto.

In an embodiment of the present disclosure, the deposition temperature ranging about 100° C. to about 500° C. or about 250° C. to about 450° C. has great potential for application in various fields by widely expanding a range of process temperatures applicable to memory devices, logic devices, and display devices. Further, since each of an aluminum-containing oxide thin film and an aluminum-containing nitride thin film has different film properties from each other, there is a need for an aluminum precursor compound usable in a wide temperature range. Therefore, it is desirable that the film should be deposited in a deposition temperature range of about 100° C. to about 500° C. or about 250° C. to about 450° C. or lower or higher than the temperature range. However, the present disclosure may not be limited thereto.

In an embodiment of the present disclosure, desirably, a gas or a gas mixture selected from argon (Ar), nitrogen ($N_2$), helium (He) and hydrogen ($H_2$) may be used as the carrier gas or the dilution gas. However, the present disclosure may not be limited thereto.

In an embodiment of the present disclosure, the aluminum precursor compound may be transferred onto the substrate by various supply methods including: a bubbling method of forcibly vaporizing the precursor using a carrier gas; a liquid delivery system (LDS) method of supplying the precursor in a liquid state at room temperature and vaporizing the precursor through a vaporizer; and a vapor flow controller (VFC) method of directly supplying the precursor using a vapor pressure of the precursor. If the vapor pressure is high, the VFC method may be used. If the vapor pressure is low, the VFC method of heating a container and vaporizing the precursor may be used. The aluminum precursor compound may be placed in a bubbler container or a VFC container and transferred and supplied into the chamber by means of a high vapor pressure or by bubbling using a carrier gas in a pressure range of about 0.1 torr to about 10 torr and a temperature range of room temperature to about 100° C. Most desirably, the LDS method of supplying the aluminum precursor compound in a liquid state at room temperature and vaporizing the precursor through a vaporizer may be used. However, the present disclosure may not be limited thereto.

In an embodiment of the present disclosure, more desirably, an argon (Ar) or nitrogen ($N_2$) gas may be used as a carrier gas or heat energy or plasma may be used or a bias may be applied onto the substrate in order to vaporize the aluminum precursor compound. However, the present disclosure may not be limited thereto.

In an embodiment of the present disclosure, desirably, one or a mixture of two or more selected from water vapor ($H_2O$), oxygen ($O_2$), $O_2$ plasma), nitrogen oxides (NO, $N_2O$), $N_2O$ plasma, oxygen nitride ($N_2O_2$), hydrogen peroxide ($H_2O_2$) and ozone ($O_3$) may be used as a reaction gas to deposit an aluminum-containing oxide thin film ($Al_2O_3$) or a complex metal aluminum-containing oxide thin film (HfAlOx, ZrAlOx, ZrHfAlOx, ZrHfSiAlOx, AlON, etc.) when the aluminum-containing film is deposited. However, the present disclosure may not be limited thereto.

In an embodiment of the present disclosure, ammonia ($NH_3$), $NH_3$ plasma, hydrazine ($N_2H_4$) and nitrogen plasma ($N_2$ Plasma) may be used as a reaction gas to deposit an aluminum-containing nitride thin film (AlN) or a complex metal nitride thin film {(AlSiN$_x$, ZrAlN$_x$, TiAlN$_x$, HfAlSiN$_x$, ZrAlSiN$_x$, TiAlSiN$_x$, HfZrAlSiN$_x$, HfZrTiAlSiN$_x$, TiAlSiN$_x$, AlCN, AlOCN, AlBN)} when the aluminum-containing film is deposited. However, the present disclosure may not be limited thereto.

Hereinafter, the present disclosure will be explained in more detail with reference to Examples. However, the following Examples are illustrative only for better understanding of the present disclosure but do not limit the present disclosure.

MODE FOR CARRYING OUT THE INVENTION

<Example 1> Preparation of tris(3-(dimethylamino)propyl)aluminum: [Me$_2$N(CH$_2$)$_3$]$_3$Al In a flame-dried 3 L round bottom flask, 28.1 g of magnesium powder (1.16 mol) was dispersed in 500 mL of tetrahydrofuran (THF), and then 70 g of 3-chloro-N,N-methylpropan-1-amine (0.58 mol) was slowly added at room temperature and refluxed for 12 hours with stirring to synthesize a Grignard reagent. 24.9 g of aluminum chloride (AlCl$_3$) (0.19 mol) and 300 mL of toluene were put into another flame-dried 3 L round-bottom flask and cooled to 0° C. Then, the prepared Grignard reagent was added using a cannula, and the temperature was slowly increased to room temperature with stirring. Thereafter, the reaction mixture was stirred for 12 hours. After completion of the reaction, the resultant salt and unreacted magnesium (Mg) were removed by filtration and the solvent and volatile by-products were removed under reduced pressure, followed by distillation to obtain 25 g (yield 47%) of a colorless liquid represented by the following Compound 1.

The boiling point: 87° C. at 0.3 torr
density: 0.89 g/mL (at 25° C.)
$^1$H-NMR (400 MHz, C$_6$D$_6$, 25° C.): δ 2.22 (t, 6H, [(CH$_3$)$_2$N(CH$_2$CH$_2$CH$_2$)]$_3$—Al), δ 2.06 (s, 18H, [(CH$_3$)$_2$N(CH$_2$CH$_2$CH$_2$)]$_3$—Al), δ 1.77 (m, 6H, [(CH$_3$)$_2$N(CH$_2$CH$_2$CH$_2$)]$_3$—Al), δ 0.02 (m, 6H, [(CH$_3$)$_2$N(CH$_2$CH$_2$CH$_2$)]$_3$—Al)

[Compound 1]

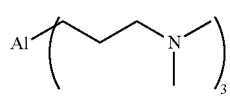

<Example 2> Preparation of Dinormal Butylaminoalane Dimer: [H$_2$AlN$^n$Bu$_2$]$_2$ 10 g of lithium aluminum hydroxide (LiAlH$_4$) (0.263 mol) and 300 mL of diethyl ether (Et$_2$O) were put into a flame-dried 1 L round bottom flask. 11.71 g of aluminum chloride (AlCl$_3$) (0.088 mol) and 200 mL of diethyl ether (Et$_2$O) were put into another flame-dried 500 mL round bottom flask. Each flask was cooled to −78° C. and the aluminum chloride solution in the second flask was slowly added to the first flask using a cannula with stirring. This mixture solution was heated to room temperature and stirred for 4 hours. After completion of the reaction, the mixture solution was cooled to between 0° C. to 10° C., and 45.4 g of dibutylamine (HN$^n$Bu$_2$) (0.351 mol) was slowly added dropwise. Then, the reaction solution was heated to room temperature, followed by stirring for 12 hours. After completion of the reaction, the resultant salt formed during the reaction was removed by filtration and the solvent and volatile by-products were removed through vacuum distillation to obtain 74 g (yield 67%) of dinormal butylaminoalane dimer [H$_2$AlN$^n$Bu$_2$]$_2$, which is a colorless liquid compound represented by the following Compound 2.

The boiling point: 71.5° C. at 0.26 torr
density: 0.9 g/mL (at 25° C.)
$^1$H-NMR (400 MHz, C$_6$D$_6$, 25° C.): δ 4.31 (br, 4H, AlH$_2$), δ 2.98, 2.95, 2.94 (t, 8H, Al—N((CH$_2$CH$_2$CH$_2$CH$_3$)$_2$), δ 1.49 (m, 8H, Al—N((CH$_2$CH$_2$CH$_2$CH$_3$)$_2$), δ 1.13 (m, 8H, Al—N((CH$_2$CH$_2$CH$_2$CH$_3$)$_2$), δ 0.82, 0.80, 0.78 (t, 12H, Al—N((CH$_2$CH$_2$CH$_2$CH$_3$)$_2$).

[Compound 2]

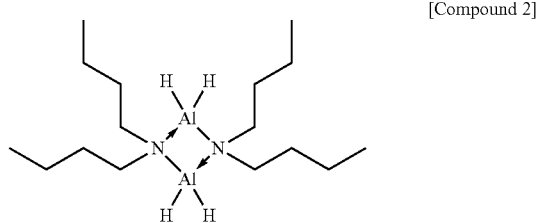

<Example 3> Preparation of N$^1$-(tert-butyl)-N$^3$,N$^3$-pyrrolidinylethane-1,3-diaminodimethylaluminum: [$^t$BuN(CH$_2$)$_2$N(C$_4$H$_8$)]AlMe$_2$ 83.6 g of n-butyllithium in 23% hexane (n-BuLi, 23% in hexane) (0.3 mol) and 300 mL of toluene were put into a flame-dried 1 L round bottom flask and then cooled to 0° C. Then, 56.2 g of $^t$BuNH(CH$_2$)$_2$N(C$_4$H$_8$) (0.3 mol) was added thereto and the reaction solution was slowly heated to room temperature with stirring for 4 hours. 40 g of aluminum chloride (AlCl$_3$) (0.3 mol) and 300 mL of toluene were put into another flame-dried 3 L round bottom flask and then cooled to 0° C. The prepared Li$^t$BuN(CH$_2$)$_2$N(C$_4$H$_8$) was slowly added thereto and stirred for 12 hours at room temperature. Thereafter, the reaction mixture was cooled again to 0° C. and 263.8 g of methyl lithium (MeLi, 5%) (0.6 mol) was slowly added into the reaction flask, followed by stirring for 12 hours at room temperature.

After completion of the reaction, the reaction mixture was filtered through a celite pad and a glass frit to remove solid by-products, and the solvent was removed under reduced pressure, followed by vacuum distillation to obtain 44 g (yield 64.7%) of a colorless liquid compound represented by the following Compound 3.

the boiling point: 60° C. at 0.3 torr
density: 0.90 g/mL (at 25° C.)
$^1$H-NMR (400 MHz, $C_6D_6$, 25° C.): δ 2.86 (t, 2H, [$(CH_3)_3CN(CH_2CH_2)N(CH_2CH_2CH_2CH_2)$]—Al), δ 2.83 (m, 2H, [$(CH_3)_3CN(CH_2CH_2)N(CH_2CH_2CH_2CH_2)$]—Al), δ 2.33 (t, 2H, [$(CH_3)_3CN(CH_2CH_2)N(CH_2CH_2CH_2CH_2)$]—Al), δ 1.63 (m, 2H, [$(CH_3)_3CN(CH_2CH_2)N(CH_2CH_2CH_2CH_2)$]—Al), δ 1.40 (m, 2H, [$(CH_3)_3CN(CH_2CH_2)N(CH_2CH_2CH_2CH_2)$]—Al), δ 1.36 (s, 9H, [$(CH_3)_3CN(CH_2CH_2)N(CH_2CH_2CH_2CH_2)$]—Al), δ 1.14 (m, 2H, [$(CH_3)_3CN(CH_2CH_2)N(CH_2CH_2CH_2CH_2)$]—Al), δ -0.46 (s, 6H, Al—$(CH_3)_2$).

[Compound 3]

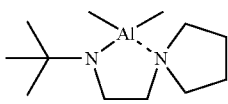

<Example 4> Preparation of $N^1$-(tert-butyl)-$N^3$,$N^3$-pyrrolidinylethane-1,3-diamino-bisdimethylamino-aluminum: [$^tBuN(CH_2)_2N(C_4H_8)$]Al$(NMe_2)_2$]

36.4 g of n-butyllithium (n-BuLi, 23%) (0.13 mol) and 300 mL of toluene were put into a flame-dried 1 L round bottom flask and then cooled to 0° C. Then, 24.5 g of $^tBuNH(CH_2)_3N(C_4H_8)$ (0.14 mol) was added thereto and the reaction solution was slowly heated to room temperature with stirring for 4 hours. 17.4 g of aluminum chloride ($AlCl_3$) (0.13 mol) and 300 mL of toluene were put into another flame-dried 3 L round bottom flask and then cooled to 0° C. The prepared Li$^tBuN(CH_2)_2N(C_4H_8)$ was slowly added thereto and stirred for 12 hours at room temperature. Thereafter, the reaction mixture was cooled again to 0° C. and 14 g of lithium dimethylamide (0.27 mol) was slowly added into the reaction flask, followed by stirring for 12 hours at room temperature.

After completion of the reaction, the reaction mixture was filtered through a celite pad and a glass frit to remove solid by-products, and the solvent was removed under reduced pressure, followed by vacuum distillation to obtain 15.7 g (yield 42.4%) of a white solid compound represented by the following Compound 4.

the boiling point: 81.1° C. at 0.3 torr
the melting point: 51° C.
$^1$H-NMR (400 MHz, $C_6D_6$, 25° C.): δ 2.86 (s, 12H, Al—$(NCH_3)_2$), δ 2.85 (m, 2H, [$(CH_3)_3CN(CH_2CH_2)N(CH_2CH_2CH_2CH_2)$]—Al), δ 2.76 (t, 2H, [$(CH_3)_3CN(CH_2CH_2)N(CH_2CH_2CH_2CH_2)$]—Al), δ 2.24 (t, 2H, [$(CH_3)_3CN(CH_2CH_2)N(CH_2CH_2CH_2CH_2)$]—Al), δ 1.70 (m, 2H, [$(CH_3)_3CN(CH_2CH_2)N(CH_2CH_2CH_2CH_2)$]—Al), δ 1.47 (m, 2H, [$(CH_3)_3CN(CH_2CH_2)N(CH_2CH_2CH_2CH_2)$]—Al), δ 1.35 (s, 9H, [$(CH_3)_3CN(CH_2CH_2)N(CH_2CH_2CH_2CH_2)$]—Al), δ 1.20 (m, 2H, [$(CH_3)_3CN(CH_2CH_2)N(CH_2CH_2CH_2CH_2)$]—Al).

[Compound 4]

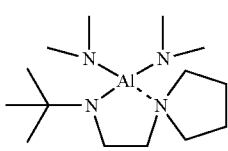

<Example 5> Preparation of N-(tert-butyl)-N',N'-dimethylpropane-1,3-diaminodimethylaluminum: [$^tBuN(CH_2)_3NMe_2$]AlMe$_2$ 83.6 g of n-butyllithium (n-BuLi, 23%) (0.3 mol) and 300 mL of toluene were put into a flame-dried 1 L round bottom flask and then cooled to 0° C. Then, 52.2 g of $^tBuNH(CH_2)_3NMe_2$ (0.3 mol) was added thereto and the reaction solution was slowly heated to room temperature with stirring for 4 hours. 40 g of aluminum chloride ($AlCl_3$) (0.3 mol) and 300 mL of toluene were put into another flame-dried 3 L round bottom flask and then cooled to 0° C. The prepared Li$^tBuN(CH_2)_3NMe_2$ was slowly added thereto and stirred for 12 hours at room temperature. Thereafter, the reaction mixture was cooled again to 0° C. and 263.8 g of methyl lithium (MeLi, 5%) (0.6 mol) was slowly added into the reaction flask, followed by stirring for 12 hours at room temperature.

After completion of the reaction, the reaction mixture was filtered through a celite pad and a glass frit to remove solid by-products, and the solvent was removed under reduced pressure, followed by vacuum distillation to obtain 42 g (yield 65.6%) of a colorless liquid compound represented by the following Compound 5.

the boiling point: 46.6° C. at 0.3 torr
density: 0.88 g/mL (at 25° C.)
$^1$H-NMR (400 MHz, $C_6D_6$, 25° C.): δ 2.97 (t, 2H, [$(CH_3)_3CN(CH_2CH_2CH_2)N(CH_3)_2$]—Al), δ 2.00 (t, 2H, [$(CH_3)_3CN(CH_2CH_2CH_2)N(CH_3)_2$]—Al), δ 1.77 (s, 6H, [$(CH_3)_3CN(CH_2CH_2CH_2)N(CH_3)_2$]—Al), δ 1.29 (s, 9H, [$(CH_3)_3CN(CH_2CH_2CH_2)N(CH_3)_2$]—Al), δ 1.27 (t 2H, [$(CH_3)_3CN(CH_2CH_2CH_2)N(CH_3)_2$]—Al), δ -0.5 (s, 6H, Al—$(CH_3)_2$).

[Compound 5]

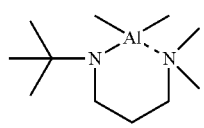

<Example 6> Preparation of N,N'-diisopropyl-2-methylamitinate-N'',N'''-diisopropylethylenediaminoaluminum: ($^iPrNCMeN^iPr$)Al[$^iPrN(CH_2)_2N^iPr$]

In a flame-dried 1 L round bottom flask, 40.13 g of N,N'-diisopropylcarbodiimide (0.32 mol) was dissolved in 300 mL of diethyl ether. The reaction mixture was cooled to 0° C. and 145.5 g of methyl lithium (0.32 mol) dissolved at 1.6 M in diethyl ether (MeLi, 1.6 M in Diethyl ether) was added thereto using a cannula, and the temperature was slowly increased to room temperature with stirring for 2 hours. In another flame-dried 1 L round bottom flask, 42.43 g of aluminum chloride ($AlCl_3$) (0.32 mol) was dissolved in 200 mL of diethyl ether and cooled to -78° C. The reactant in the first flask was slowly added to the second flask using a cannula with stirring and then slowly heated to room temperature with stirring for 12 hours. After completion of the reaction, the resultant salt was removed by filtration and the solvent and volatile by-products were removed under reduced pressure to obtain 71.73 g of N,N'-diisopropyl-2-methylamitinate aluminum dichloride [($^iPrNCMeN^iPr$)AlCl$_2$] (0.3 mol), which is a solid intermediate compound.

In a flame-dried 1 L round bottom flask, 170 g of n-butyllithium in 23% hexane (n-BuLi, 23% in hexane)

(0.64 mol) was dissolved in 300 mL of hexane and then cooled to 0° C. 45.9 g of N,N'-diisopropylethylenediamine [$^i$PrNH(CH$_2$)$_2$NH$^i$Pr] (0.32 mol) was added thereto and the reaction mixture was slowly heated to room temperature with stirring for 3 hours. In another flame-dried 1 L round bottom flask, the synthesized intermediate compound, 71.73 g of N,N'-diisopropyl-2-methylamitinate aluminum dichloride [($^i$PrNCMeN$^i$Pr)AlCl$_2$] (0.3 mol), was dissolved in 300 mL of hexane and the synthesized Li$_2$[$^i$PrN(CH)$_2$N$^i$Pr] solution was slowly added thereto at room temperature paying attention to the generation of heat, followed by stirring for 12 hours. After completion of the reaction, the resultant salt formed during the reaction was removed by filtration and the solvent was removed under reduced pressure, followed by vacuum distillation to obtain 49 g (yield 46.9%) of N,N'-diisopropyl-2-methylamitinate-N'',N'''-diisopropylethylenediaminoaluminum [($^i$PrNCMeN$^i$Pr)Al($^i$PrNCH$_2$CH$_2$N$^i$Pr)], which is a yellow liquid compound represented by the following Compound 6.

the boiling point: 67.2° C. at 0.32 torr
density: 1.04 g/mL (at 25° C.)
$^1$H-NMR (400 MHz, C$_6$D$_6$, 25° C.): δ 1.06, 1.08 [d, 12H, {(CH$_3$)$_2$CHNC(CH$_3$)NCH(CH$_3$)$_2$}Al], δ 1.23 [s, 3H, {(CH$_3$)$_2$CHNC(CH$_3$)NCH(CH$_3$)$_2$}Al], δ 1.31, 1.32 [d, 12H, Al{(CH$_3$)$_2$CHNCH$_2$CH$_2$NCH(CH$_3$)$_2$}], δ 3.11 [m, 2H, {(CH$_3$)$_2$CHNC(CH$_3$)NCH(CH$_3$)$_2$}Al], δ 3.32 [m, 2H, Al{(CH$_3$)$_2$CHNCH$_2$CH$_2$NCH(CH$_3$)$_2$}], δ 3.44 [s, 4H, Al{(CH$_3$)$_2$CHNCH$_2$CH$_2$NCH(CH$_3$)$_2$}].

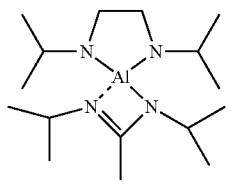

[Compound 6]

<Example 7> Preparation of N$^1$,N$^2$-diisopropylethane-1,2-diamino-N$^1$-ethyl-N$^2$,N$^2$-dimethylethane-1,2-diaminoaluminum: [$^i$PrN(CH$_2$)$_2$N$^i$Pr]Al[EtN(CH$_2$)$_2$NMe$_2$]

167.1 g of n-butyllithium in 23% hexane (n-BuLi, 23% in hexane) (0.6 mol) and 300 mL of toluene were put into a flame-dried 1 L round bottom flask and then cooled to 0° C. 47.6 g of N,N'-diisopropylethylenediamine [$^i$PrNH(CH$_2$)$_2$NH$^i$Pr] (0.33 mol) was slowly added thereto and the reaction solution was slowly heated to room temperature with stirring for 4 hours. 40 g of aluminum chloride (AlCl$_3$) (0.3 mol) and 300 mL of toluene were put into another flame-dried 3 L round bottom flask and then cooled to 0° C. The prepared Li$_2$[$^i$PrN(CH)$_2$N$^i$Pr] solution was slowly added thereto paying attention to the generation of heat, followed by stirring for 12 hours at room temperature.

83.6 g of n-butyllithium in 23% hexane (n-BuLi, 23% in hexane) (0.3 mol) and 300 mL of toluene were put into a flame-dried 1 L round bottom flask and then cooled to 0° C. Thereafter, 38.3 g of EtNH(CH$_2$)$_2$NMe$_2$ (0.33 mol) was added thereto and the reaction solution was slowly heated to room temperature with stirring for 4 hours. The resultant mixture was added to the prepared reaction flask and then stirred for 12 hours. After completion of the reaction, the reaction mixture was filtered through a celite pad and a glass frit to remove solid by-products, and the solvent was removed under reduced pressure, followed by vacuum distillation to obtain 58.1 g (yield 50%) of a colorless liquid compound represented by the following Compound 7.

the boiling point: 82.9° C. at 0.3 torr
density: 0.93 g/mL (at 25° C.)
$^1$H-NMR (400 MHz, C$_6$D$_6$, 25° C.): δ 3.28, 3.27 (m, 4H, [(CH$_3$)$_2$CN(CH$_2$CH$_2$)NC(CH$_3$)$_2$]—Al), δ 3.26 (m, 2H, Al—[CH$_3$CH$_2$N(CH$_2$CH$_2$)N(CH$_3$)$_2$), δ 3.01 (q, 2H, [(CH$_3$)$_2$CHN(CH$_2$CH$_2$)NHC(CH$_3$)$_2$]—Al), δ 2.67 (t, 2H, Al—[CH$_3$CH$_2$N(CH$_2$CH$_2$)N(CH$_3$)$_2$]), δ 2.14 (t, 2H, [CH$_3$CH$_2$N(CH$_2$CH$_2$)N(CH$_3$)$_2$]), δ 1.91 (s, 6H, [CH$_3$CH$_2$N(CH$_2$CH$_2$)N(CH$_3$)$_2$]), δ 1.36 (m, 3H, Al—[CH$_3$CH$_2$N(CH$_2$CH$_2$)N(CH$_3$)$_2$]), δ 1.31, 1.28 (d, 12H, [(CH$_3$)$_2$CHN(CH$_2$CH$_2$)NCH(CH$_3$)$_2$]—Al).

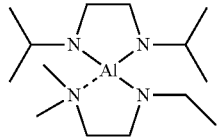

[Compound 7]

<Example 8> Atomic Layer Deposition of Aluminum Oxide Film Using O$_2$ Gas Plasma Aluminum oxide films were formed by plasma enhanced atomic layer deposition (PEALD) using the aluminum compound 5, [$^t$BuN(CH$_2$)$_3$NMe$_2$]AlMe$_2$, prepared according to Example 5 and the aluminum compound 7, [$^i$PrN(CH$_2$)$_2$N$^i$Pr]Al[EtN(CH$_2$)$_2$NMe$_2$], prepared according to Example 7 as a precursor. O$_2$ gas plasma formed by applying 200 W RF power to a PEALD reactor while supplying O$_2$ gas was used as a reaction gas. A piece of single crystal silicon from which the native oxide had been removed was used as a substrate. The substrate was heated to 250° C. to 450° C. and an aluminum oxide thin film was formed thereon by PEALD. Stainless steel containers containing the respective aluminum precursor compounds were heated to 55° C. for [$^t$BuN(CH$_2$)$_3$NMe$_2$]AlMe$_2$ and 90° C. for [$^i$PrN(CH$_2$)$_2$N$^i$Pr]Al[EtN(CH$_2$)$_2$NMe$_2$], and an Ar carrier gas was allowed to flow at a flow rate of 200 sccm to supply the vaporized aluminum precursor compounds to the PEALD reactor. A PEALD gas supply cycle composed of supply of [$^t$BuN(CH$_2$)$_3$NMe$_2$]AlMe$_2$ for 15 sec—supply of Ar purge gas for 10 sec—supply of O$_2$ gas plasma for 5 sec—supply of Ar purge gas for 10 sec was repeated 100 times to form an aluminum oxide film. Also, a PEALD gas supply cycle composed of supply of [$^i$PrN(CH$_2$)$_2$N$^i$Pr]Al[EtN(CH$_2$)$_2$NMe$_2$] for 20 sec—supply of Ar purge gas for 10 sec—supply of O$_2$ gas plasma for 5 sec—supply of Ar purge gas for 10 sec was repeated 100 times to form an aluminum oxide film. For comparison, a PEALD gas supply cycle composed of supply of TMA, vaporized at room temperature, for 1 sec—supply of Ar purge gas for 5 sec—supply of O$_2$ gas plasma for 5 sec—supply of Ar purge gas for 10 sec was repeated 100 times to form an aluminum oxide film. The thickness of the aluminum oxide films thus formed was measured using an ellipsometer, and the growth-per-cycle per ALD gas supply cycle depending on the substrate temperature and the aluminum precursor compound used is shown in FIG. 1.

As can be seen from FIG. 1, the aluminum precursor compounds, [$^t$BuN(CH$_2$)$_3$NMe$_2$]AlMe$_2$ and [$^i$PrN(CH$_2$)$_2$N$^i$Pr]Al[EtN(CH$_2$)$_2$NMe$_2$], prepared according to Examples 5 and 7 show a constant growth-per-cycle (GPC) per PEALD gas supply cycle in the range of 250° C. to 450° C. Compared to TMA, the aluminum precursor compounds of the present disclosure show a constant GPC even when the temperature is changed. Therefore, they are advantageous in forming a thin film with a uniform thickness.

<Example 9> Atomic Layer Deposition of Aluminum Oxide Film Using O₃ Gas

Aluminum oxide films were formed by atomic layer deposition (ALD) using the aluminum precursor compounds 1 and 6, [Me$_2$N(CH$_2$)$_3$]$_3$Al and ($^i$PrNCMeN$^i$Pr)Al[$^i$PrN(CH$_2$)$_2$N$^i$Pr], prepared according to Examples 1 and 6. Ozone (O$_3$) gas was used as a reaction gas.

A piece of single crystal silicon from which the native oxide had been removed was used as a substrate. The substrate was heated to 300° C. to 350° C. and an aluminum oxide thin film was formed thereon by ALD. Stainless steel containers containing the aluminum precursor compounds were respectively heated to 110° C. for [Me$_2$N(CH$_2$)$_3$]$_3$Al and 75° C. for ($^i$PrNCMeN$^i$Pr)Al[$^i$PrN(CH$_2$)$_2$N$^i$Pr], and an Ar carrier gas was allowed to flow at a flow rate of 200 sccm to supply the vaporized aluminum precursor compounds to an ALD reactor. An ALD gas supply cycle composed of supply of [Me$_2$N(CH$_2$)$_3$]$_3$Al for 25 sec—supply of Ar purge gas for 10 sec—supply of O$_3$ gas for 10 sec—supply of Ar purge gas for 10 sec was repeated 100 times to form an aluminum oxide film. An ALD gas supply cycle composed of supply of ($^i$PrNCMeN$^i$Pr)Al[$^i$PrN(CH$_2$)$_2$N$^i$Pr] for 15 sec—supply of Ar purge gas for 10 sec—supply of O$_3$ gas for 10 sec—supply of Ar purge gas for 10 sec was repeated 100 times to form an aluminum oxide film. For comparison, an ALD gas supply cycle composed of supply of TMA, vaporized at room temperature, for 1 sec—supply of Ar purge gas for 5 sec—supply of O$_3$ gas for 10 sec—supply of Ar purge gas for 10 sec was repeated 100 times to form an aluminum oxide film. The thickness of the aluminum oxide films thus formed was measured using an ellipsometer, and the growth-per-cycle per ALD gas supply cycle depending on the substrate temperature and the aluminum precursor compound used is shown in FIG. 2.

As can be seen from FIG. 2, the GPC was lower in the ALD using the aluminum compounds [Me$_2$N(CH$_2$)$_3$]$_3$Al and ($^i$PrNCMeN$^i$Pr)Al[$^i$PrN(CH$_2$)$_2$N$^i$Pr] prepared according to Examples 1 and 6 as a precursor than in the ALD using TMA. Therefore, when an aluminum oxide film with a thickness of several nm or 1 nm or less is formed, the thickness can be controlled more precisely.

<Test Example 1> Component Analysis of Aluminum Oxide Film Using O$_2$ Plasma

The components of the aluminum oxide films formed at 400° C. by PEALD according to Example 8 were analyzed by secondary ion mass spectrometry (SIMS), and the results thereof are shown in FIG. 3 and FIG. 4. FIG. 3 shows the composition depending on the thickness of the aluminum oxide film formed by PEALD using the compound 5 prepared according to Example 5 as a precursor. It can be seen from FIG. 3 that the aluminum oxide film was formed based on the magnitude of oxygen ion signal and the magnitude of aluminum-related ion signal.

Further, FIG. 4 shows the carbon content depending on the thickness of the aluminum oxide films formed using the aluminum compound 5 and 7 prepared according to Examples 5 and 7 and TMA as a precursor. Referring to FIG. 4, it can be seen that the aluminum oxide films formed using the aluminum compounds 5 and 7 prepared according to Examples 5 and 7 as a precursor have a lower carbon content than the aluminum oxide film formed using TMA, and, thus, they are expected to exhibit better insulation properties.

The above description of the present disclosure is provided for the purpose of illustration, and it would be understood by a person with ordinary skill in the art that various changes and modifications may be made without changing technical conception and essential features of the present disclosure. Thus, it is clear that the above-described examples are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

We claim:

1. An aluminum precursor compound, comprising, at least one compound of:

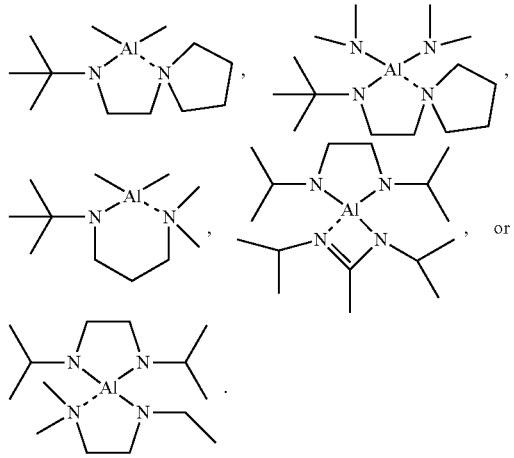

2. A precursor composition for forming an aluminum-containing film, comprising an aluminum precursor compound of claim 1.

3. The precursor composition of claim 2,
    wherein the film is at least one selected from the group consisting of an aluminum-containing metal film, an aluminum-containing oxide film, an aluminum-containing nitride film, an aluminum-containing carbide film, an aluminum-containing oxynitride film, and an aluminum-containing carbonitride film.

4. The precursor composition of claim 2, further comprising:
    at least one nitrogen source selected from the group consisting of ammonia, nitrogen, hydrazine, and dimethyl hydrazine.

5. The precursor composition of claim 2, further comprising:
    at least one oxygen source selected from the group consisting of water vapor, oxygen, and ozone.

6. A method of forming an aluminum-containing film, comprising forming an aluminum-containing film using a precursor composition for forming an aluminum-containing film including an aluminum precursor compound of claim 1.

7. The method of claim 6, wherein the film is at least one selected from the group consisting of an aluminum-containing metal film, an aluminum-containing oxide film, an aluminum-containing nitride film, an aluminum-containing carbide film, an aluminum-containing oxynitride film, and an aluminum-containing carbonitride film.

8. The method of claim 6, wherein the aluminum-containing film is deposited by chemical vapor deposition or atomic layer deposition.

9. The method of claim 6, wherein the aluminum-containing film is formed in a temperature range of 100° C. to 500° C.

10. The method of claim 6, wherein a thickness of the aluminum-containing film is 1 nm to 500 nm.

11. The method of claim 6, wherein the aluminum-containing film is formed on a substrate including a trench with an aspect ratio of 1 or more and a width of 1 μm or less.

\* \* \* \* \*